United States Patent
Tanaka et al.

(10) Patent No.: US 9,355,872 B2
(45) Date of Patent: May 31, 2016

(54) SUBSTRATE TREATMENT APPARATUS AND SUBSTRATE TREATMENT METHOD

(75) Inventors: Takayoshi Tanaka, Kyoto (JP); Mai Yamakawa, Kyoto (JP); Takahiro Yamaguchi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 994 days.

(21) Appl. No.: 13/427,452

(22) Filed: Mar. 22, 2012

(65) Prior Publication Data
US 2012/0247506 A1 Oct. 4, 2012

(30) Foreign Application Priority Data

Mar. 28, 2011 (JP) ................................. 2011-070495
Feb. 10, 2012 (JP) ................................. 2012-027423

(51) Int. Cl.
| | | |
|---|---|---|
| B08B 3/04 | (2006.01) | |
| B08B 7/00 | (2006.01) | |
| H01L 21/67 | (2006.01) | |
| H01L 21/02 | (2006.01) | |

(52) U.S. Cl.
CPC .... *H01L 21/67028* (2013.01); *H01L 21/02052* (2013.01); *H01L 21/67051* (2013.01); *H01L 21/67057* (2013.01)

(58) Field of Classification Search
CPC .................. H01L 21/02052; H01L 21/67057; H01L 21/67051; H01L 21/67028
USPC ........................................ 134/18, 26, 36, 902
See application file for complete search history.

(56) References Cited

U.S. PATENT DOCUMENTS

| | | | | |
|---|---|---|---|---|
| 5,571,560 | A | * | 11/1996 | Lin ................................ 427/240 |
| 5,785,068 | A | * | 7/1998 | Sasaki et al. ................... 134/144 |
| 5,975,098 | A | * | 11/1999 | Yoshitani .................. B08B 3/02 |
| | | | | 134/148 |
| 6,494,221 | B1 | * | 12/2002 | Sellmer et al. ................ 134/147 |
| 6,558,478 | B1 | * | 5/2003 | Katakabe et al. ............... 134/33 |
| 7,247,209 | B2 | * | 7/2007 | Robertson et al. .............. 134/33 |
| 7,314,529 | B2 | * | 1/2008 | Nakajima et al. ............... 134/26 |
| 8,739,429 | B2 | * | 6/2014 | Liu et al. ........................... 34/78 |
| 2002/0035762 | A1 | * | 3/2002 | Okuda et al. ....................... 15/77 |
| 2002/0148483 | A1 | * | 10/2002 | Mertens et al. ................. 134/1.3 |
| 2003/0013310 | A1 | | 1/2003 | Tomimori et al. ............. 438/703 |

(Continued)

FOREIGN PATENT DOCUMENTS

| | | |
|---|---|---|
| JP | 59-184530 | 10/1984 |
| JP | 61-263226 | 11/1986 |

(Continued)

OTHER PUBLICATIONS

U.S. Appl. No. 13/408,563, filed Feb. 29, 2012.

*Primary Examiner* — Alexander Markoff
(74) *Attorney, Agent, or Firm* — Ostrolenk Faber LLP

(57) ABSTRACT

A substrate treatment apparatus includes: a substrate holding unit which horizontally holds a substrate; a liquid droplet nozzle which generates droplets of a treatment liquid which are sprayed on a spouting region on an upper surface of the substrate held by the substrate holding unit; and a protective liquid nozzle which spouts a protective liquid obliquely onto the upper surface of the substrate held by the substrate holding unit for protection of the substrate to cause the protective liquid to flow toward the spouting region on the upper surface of the substrate, whereby the spouting region is covered with a film of the protective liquid and, in this state, the treatment liquid droplets are caused to impinge on the spouting region.

9 Claims, 9 Drawing Sheets

(56) References Cited

U.S. PATENT DOCUMENTS

| | | | |
|---|---|---|---|
| 2003/0079764 A1* | 5/2003 | Hirose et al. | 134/95.3 |
| 2003/0084925 A1 | 5/2003 | Nakajima et al. | 134/26 |
| 2004/0206378 A1* | 10/2004 | Okuda et al. | B08B 1/04 134/56 R |
| 2012/0247506 A1* | 10/2012 | Tanaka | H01L 21/02052 134/4 |
| 2013/0052360 A1* | 2/2013 | Maegawa et al. | 427/421.1 |
| 2013/0224956 A1* | 8/2013 | Negoro et al. | 438/697 |
| 2014/0261557 A1* | 9/2014 | Sotoku et al. | 134/22.1 |
| 2014/0261572 A1* | 9/2014 | Sotoku | H01L 21/67028 134/33 |
| 2014/0261577 A1* | 9/2014 | Furukawa et al. | 134/113 |
| 2014/0261586 A1* | 9/2014 | Sato et al. | 134/56 R |

FOREIGN PATENT DOCUMENTS

| | | |
|---|---|---|
| JP | 9-171985 | 6/1997 |
| JP | 11-67649 | 3/1999 |
| JP | 2001-334218 | 12/2001 |
| JP | 2003-31536 | 1/2003 |
| JP | 2004-335671 | 11/2004 |
| JP | 2005-085978 | 3/2005 |
| JP | 2005-347326 | 12/2005 |
| JP | 3892792 | 12/2006 |
| JP | 2008-16642 | 1/2008 |
| JP | 2008-171875 | 7/2008 |
| JP | 2009-530865 | 8/2009 |
| JP | 2011-029315 | 2/2011 |
| WO | WO 2007/111976 A2 | 10/2007 |

\* cited by examiner

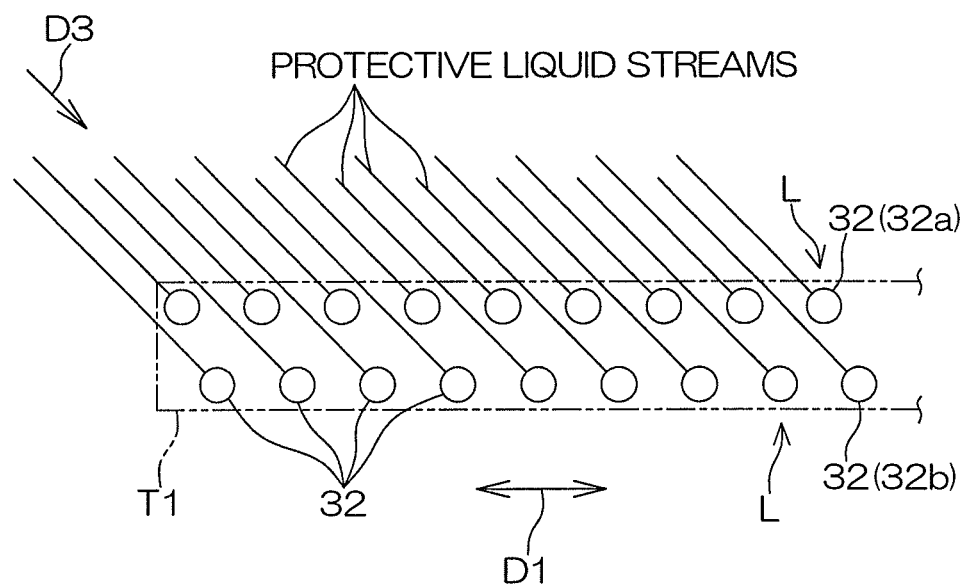

FIG. 6A  FIRST COVERING STEP
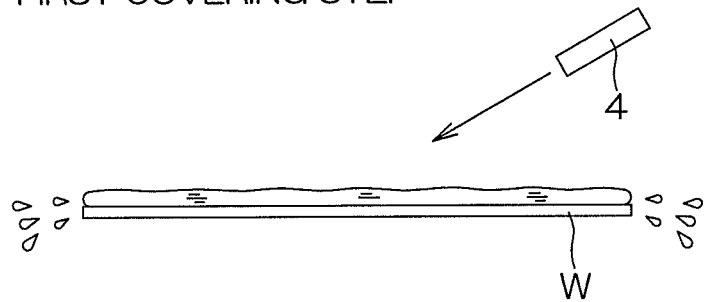
FIG. 6B  CLEANING STEP & SECOND COVERING STEP
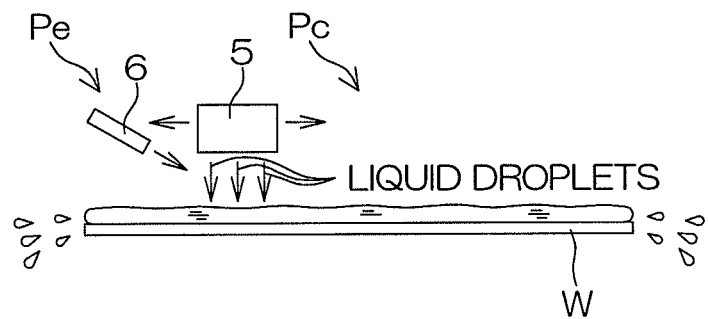
FIG. 6C  RINSING STEP
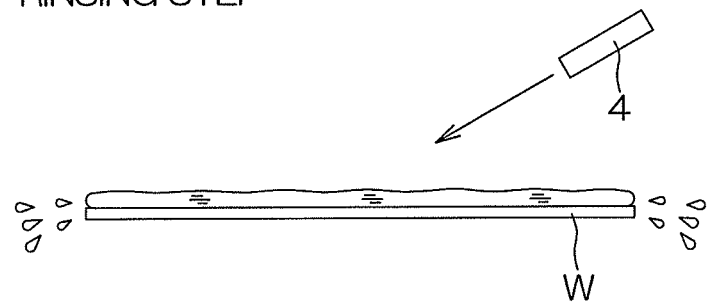
FIG. 6D  DRYING STEP
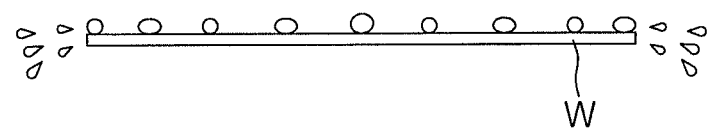

SUBSTRATE TREATMENT APPARATUS AND SUBSTRATE TREATMENT METHOD

BACKGROUND OF THE INVENTION

1. Field of the Invention

The present invention relates to a substrate treatment apparatus and a substrate treatment method for treating a substrate. Examples of the substrate to be treated include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates, and substrates for solar cells.

2. Description of the Related Art

In production processes for semiconductor devices and liquid crystal display devices, substrates such as semiconductor wafers and glass substrates for liquid crystal display panels are treated with a treatment liquid. A substrate treatment apparatus of a single substrate treatment type adapted to treat a single substrate at a time includes, for example, a spin chuck which horizontally holds and rotates the substrate, a bifluid nozzle which causes droplets of a treatment liquid to impinge on an upper surface of the substrate held by the spin chuck, and a rinse liquid nozzle which spouts a rinse liquid toward the upper surface of the substrate held by the spin chuck. In the substrate treatment apparatus, the substrate is cleaned by causing the treatment liquid droplets to impinge on the upper surface of the substrate while covering the upper surface of the substrate with the rinse liquid.

In a substrate treatment apparatus disclosed in U.S. Patent Application Publication No. US 2003/0084925 A1, the bifluid nozzle spouts the treatment liquid toward a certain region (hereinafter referred to as "spouting region") on the upper surface of the substrate. A part of the rinse liquid supplied to the substrate spreads toward the spouting region on the substrate. However, the rinse liquid flowing to the spouting region is prevented from entering the spouting region by the treatment liquid droplets, because the treatment liquid droplets are vigorously sprayed on the spouting region. Therefore, the rinse liquid hardly reaches the spouting region, failing to form a sufficiently thick rinse liquid film on the spouting region. Therefore, the treatment liquid droplets are sprayed on the spouting region which is not covered with the liquid film or is covered with a thin liquid film. The impingement of the liquid droplets on the substrate results insignificant impact on a pattern formed on the substrate, causing damages such as collapse of the pattern.

SUMMARY OF THE INVENTION

It is an object of the present invention to provide a substrate treatment apparatus and a substrate treatment method which suppress damages to a substrate.

The present invention provides a substrate treatment apparatus, which includes: a substrate holding unit which horizontally holds a substrate; a liquid droplet nozzle which generates droplets of a treatment liquid which are sprayed on a spouting region on an upper surface of the substrate held by the substrate holding unit; and a protective liquid nozzle which spouts a protective liquid obliquely onto the upper surface of the substrate held by the substrate holding unit for protection of the substrate to cause the protective liquid to flow toward the spouting region on the upper surface of the substrate, whereby the spouting region is covered with a film of the protective liquid and, in this state, the treatment liquid droplets are caused to impinge on the spouting region.

With this arrangement, the treatment liquid is spouted from the liquid droplet nozzle toward the upper surface of the substrate held by the substrate holding unit. Thus, the treatment liquid droplets are sprayed on the spouting region on the upper surface of the substrate. Simultaneously with the spouting of the treatment liquid from the liquid droplet nozzle, the protective liquid is spouted from the protective liquid nozzle toward the upper surface of the substrate. The protective liquid spouted from the protective liquid nozzle collides against the substrate to be deflected, and spreads on the substrate to flow toward the spouting region on the upper surface of the substrate. The protective liquid spreading on the substrate flows into the spouting region against the treatment liquid droplets sprayed on the spouting region. That is, the flow speed of the protective liquid flowing on the substrate is controlled to permit the protective liquid to flow into the spouting region against the treatment liquid droplets by setting flow speed control conditions including at least one of a protective liquid spouting speed at which the protective liquid is spouted from the protective liquid nozzle, a protective liquid spouting direction in which the protective liquid is spouted from the protective liquid nozzle, a distance between the protective liquid nozzle and the liquid droplet nozzle, an angle defined between the spouting direction and the upper surface of the substrate and a substrate rotation speed.

More specifically, the protective liquid spouting direction in which the protective liquid is spouted from the protective liquid nozzle is tilted with respect to the upper surface of the substrate. Therefore, the protective liquid is decelerated at a lower deceleration rate when being deflected, as compared with a case in which the protective liquid spouting direction is perpendicular to the upper surface of the substrate. Accordingly, the protective liquid spouted from the protective liquid nozzle flows at a relatively high speed to reach the spouting region. Thus, the protective liquid flows into the spouting region against the treatment liquid droplets sprayed on the spouting region. In this manner, the protective liquid is supplied to the spouting region, and the protective liquid film is formed on the spouting region as having a sufficient thickness. Thus, the spouting region is covered with the protective liquid film (i.e., protection film) and, in this state, the treatment liquid droplets impinge on the spouting region. This alleviates an impact to a pattern formed on the substrate, thereby suppressing damages to the substrate.

Since the protective liquid spouting direction is tilted with respect to the upper surface of the substrate, the protective liquid spreads within a relatively small area on the substrate. That is, where the spouting direction is perpendicular to the upper surface of the substrate, the protective liquid spreads radially on the substrate. In contrast, where the spouting direction is tilted with respect to the upper surface of the substrate, the protective liquid triangularly spreads on the substrate. Therefore, the flow rate of the supplied protective liquid observed at a given position on the substrate is higher than that observed when the spouting direction is perpendicular to the upper surface of the substrate. Thus, the protective liquid can be supplied to the spouting region at a higher flow rate than when the spouting direction is perpendicular to the upper surface of the substrate. This increases the thickness of the liquid film covering the spouting region, thereby suppressing the damages to the substrate.

The spouting region may have a rectangular shape extending in a longitudinal direction. In this case, the protective liquid nozzle preferably spouts the protective liquid so that the protective liquid spouted from the protective liquid nozzle can flow into the spouting region obliquely with respect to the longitudinal direction as seen in plan.

With this arrangement, the protective liquid flowing on the upper surface of the substrate enters the spouting region obliquely with respect to the longitudinal direction of the spouting region as seen in plan. Therefore, the protective liquid passes obliquely across the spouting region. A path along which the protective liquid passes obliquely across the spouting region is shorter than a path along which the protective liquid passes longitudinally across the spouting region. The protective liquid entering the spouting region is prevented from flowing on by the treatment liquid droplets. If the path is longer, there is a possibility that the protective liquid cannot reach the end of the path. That is, there is a possibility that the protective liquid is not supplied to the entire spouting region. By shortening the path of the protective liquid, the protective liquid can be reliably supplied to the entire spouting region. Thus, the protective liquid film can be reliably formed as covering the entire spouting region.

According to one embodiment of the present invention, the substrate treatment apparatus further includes a rotation unit which rotates the substrate about a vertical rotation axis extending through a center portion of the upper surface of the substrate, and the protective liquid nozzle spouts the protective liquid toward a target position located upstream of the spouting region with respect to a substrate rotation direction in which the substrate is rotated by the rotation unit.

With this arrangement, the protective liquid is spouted from the protective liquid nozzle toward the target position on the upper surface of the substrate while the substrate is rotated about the vertical rotation axis extending through the center portion of the upper surface of the substrate. Therefore, the protective liquid spouted from the protective liquid nozzle collides against the substrate at the target position to be deflected, and spreads on the substrate to flow to the spouting region. Since the protective liquid is supplied to the rotating substrate, the protective liquid supplied to the substrate is accelerated radially (in a rotation radial direction) due to contact with the substrate and accelerated in the substrate rotation direction. Therefore, the protective liquid supplied to the substrate spreads radially from the target position while flowing in the rotation direction.

The target position is located upstream of the spouting region with respect to the substrate rotation direction. If the target position were located downstream of the spouting region, the protective liquid supplied to the target position would be expelled around the substrate before reaching the spouting region. Even if the protective liquid could reach the spouting region, the flow speed and the flow rate of the protective liquid flowing into the spouting region would be lower than those observed when the target position is located upstream of the spouting region. By spouting the protective liquid toward the position (target position) upstream of the spouting region with respect to the substrate rotation direction, the protective liquid can be reliably supplied to the spouting region. Thus, the protective liquid film can be formed as covering the spouting region.

The substrate treatment apparatus may further include a nozzle movement unit which moves the liquid droplet, nozzle and the protective liquid nozzle so as to move the spouting region between the center portion and a peripheral edge portion of the upper surface of the substrate while keeping the liquid droplet nozzle and the protective liquid nozzle in a predetermined positional relationship. The nozzle movement unit may include a nozzle arm which holds the liquid droplet nozzle and the protective liquid nozzle, and an arm movement unit which moves the nozzle arm.

With this arrangement, the nozzle movement unit moves the liquid droplet nozzle and the protective liquid nozzle so as to move the spouting region between the center portion and the peripheral edge portion of the upper surface the substrate. By causing the nozzle movement unit to move the liquid droplet nozzle and the protective liquid nozzle while causing the rotation unit to rotate the substrate about the rotation axis, the upper surface of the substrate is scanned with the spouting region, whereby the spouting region passes over the entire upper surface of the substrate. Thus, the treatment liquid droplets impinge on the entire upper surface of the substrate to remove the foreign matter from the substrate. Further, the nozzle movement unit moves the liquid droplet nozzle and the protective liquid nozzle while keeping the liquid droplet nozzle and the protective liquid nozzle in the predetermined positional relationship (e.g., in a predetermined spaced relationship or in a predetermined attitude relationship). Therefore, the protective liquid spouted from the protective liquid nozzle can be reliably supplied to the target position. Thus, the protective liquid can reliably flow into the spouting region to form the protective liquid film covering the spouting region.

The substrate treatment apparatus preferably further includes a flow speed control unit which controls the flow speed of the protective liquid flowing on the substrate so that the protective liquid spouted from the protective liquid nozzle flows into the spouting region at a constant flow speed wherever the spouting region is located on the upper surface of the substrate. The flow speed control unit may include a rotation speed control unit which controls the rotation speed of the substrate, and a spouting speed control unit which controls the spouting speed of the protective liquid spouted from the protective liquid nozzle.

With this arrangement, the flow speed control unit controls the flow speed of the protective liquid flowing on the substrate, for example, by controlling the rotation speed of the substrate rotated by the rotation unit and the spouting speed of the protective liquid spouted from the protective liquid nozzle, when the rotation unit rotates the substrate and the nozzle movement unit moves the liquid droplet nozzle and the protective liquid nozzle. As described above, the protective liquid supplied to the substrate is accelerated by the rotation of the substrate. The circumferential speed of the substrate decreases in a direction toward the center (rotation center) of the upper surface of the substrate. Therefore, if the substrate rotation speed and the protective liquid spouting speed are constant, the flow speed of the protective liquid at a given position on the substrate is reduced as a distance between the given position and the rotation center decreases. If a distance between the target position and the rotation center is shorter, the protective liquid flows into the spouting region at a lower flow-in speed. The flow speed control unit can stabilize the flow speed of the protective liquid on the substrate, for example, by changing the substrate rotation speed and/or the protective liquid spouting speed according to the distance between the target position and the rotation center. Thus, the protective liquid can flow into the spouting region at a constant flow speed. Even if the distance between the target position and the rotation center is shorter, i.e., even if the spouting region is located at a position at which the substrate circumferential speed is lower, the protective liquid film can be reliably formed as covering the spouting region.

According to one embodiment of the present invention, the liquid droplet nozzle has a surface opposed to the spouting region and having a spout from which the treatment liquid droplets are spouted. With this arrangement, the treatment liquid droplets are spouted from the spout provided in the opposed surface with the upper surface of the substrate being opposed to the opposed surface. Thus, the treatment liquid droplets are sprayed on the spouting region. The protective liquid spreading on the substrate flow into a space defined between the opposed surface of the liquid droplet nozzle and the upper surface of the substrate to cover the spouting region to thereby form the protective liquid film covering the spouting region. Even if the spouting region is covered with the liquid droplet nozzle, the protective liquid is spouted obliquely toward the upper surface of the substrate to reach the spouting region at a relatively high flow speed. This makes it possible to cause the treatment liquid droplets to impinge on the spouting region while protecting the spouting region with the protective liquid film, thereby suppressing the damages to the substrate.

The protective liquid nozzle preferably spouts the protective liquid at a spouting speed of not less than 1.6 m/s. Even if the treatment liquid droplets are sprayed on the spouting region, as will be described later, the protective liquid spouted from the protective liquid nozzle at a spouting speed of not less than 1.6 m/s can flow into the spouting region against the treatment liquid droplets. Thus, the protective liquid film can be formed as covering the spouting region by supplying the protective liquid to the spouting region.

The present invention also provides a substrate treatment method, which includes a substrate holding step of horizontally holding a substrate, a liquid droplet supplying step of spraying droplets of a treatment liquid from a liquid droplet nozzle to a spouting region on an upper surface of the held substrate, and a step of spouting a protective liquid from a protective liquid nozzle obliquely to the upper surface of the substrate to form a stream of the protective liquid flowing toward the spouting region on the upper surface of the held substrate and causing the treatment liquid droplets to impinge on the spouting region while covering the spouting region with a film of the protective liquid.

The foregoing and other objects, features and effects of the present invention will become more apparent from the following detailed description of the preferred embodiments with reference to the attached drawings.

BRIEF DESCRIPTION OF THE DRAWINGS

FIG. 5 is a diagram illustrating a part of FIG. 4 on a greater scale.

FIGS. 6A to 6D are diagrams for explaining an exemplary substrate treatment process to be performed by the substrate treatment apparatus according to the first embodiment of the present invention.

DETAILED DESCRIPTION OF THE PREFERRED EMBODIMENTS

Figure 1:
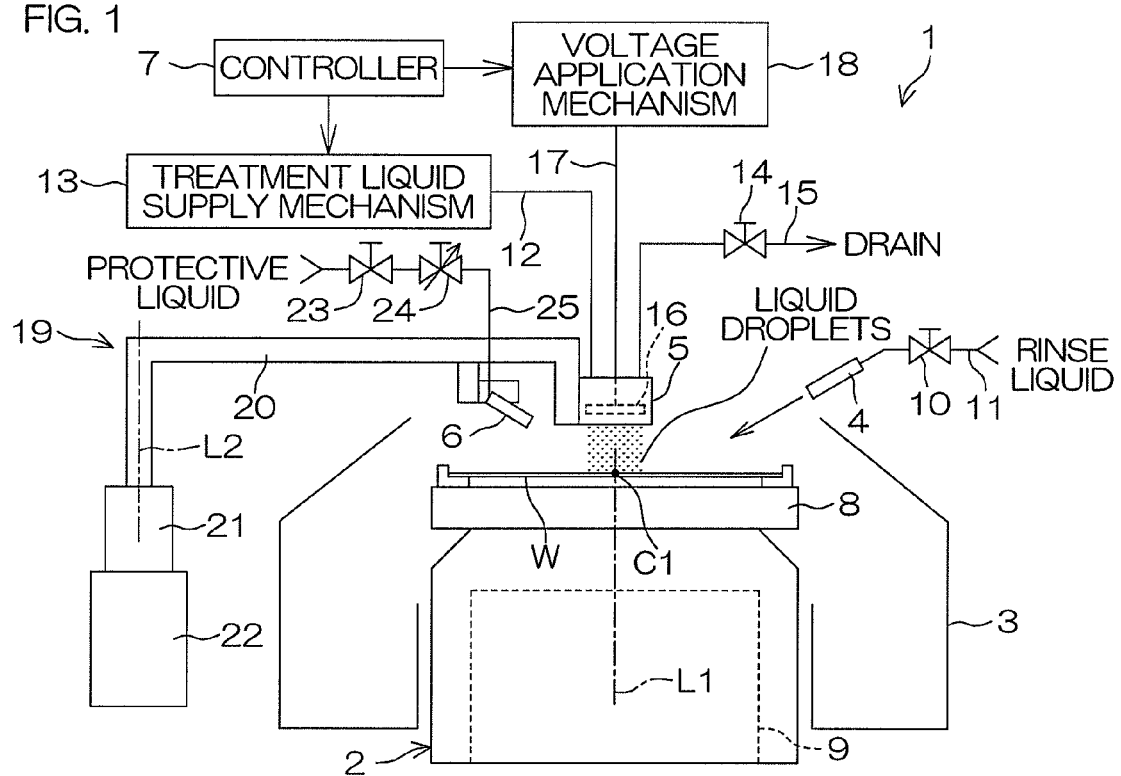
FIG. 1 is a schematic diagram schematically showing the construction of a substrate treatment apparatus according to a first embodiment of the present invention.
Figure 2:
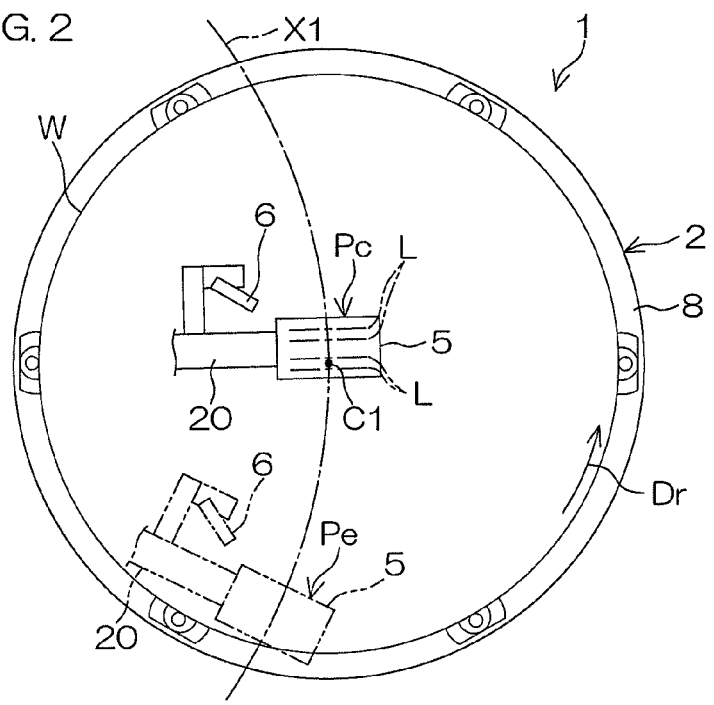
FIG. 2 is a plan view illustrating a liquid droplet nozzle and an associated arrangement according to the first embodiment of the present invention.

FIG. 1 is a schematic diagram schematically showing the construction of a substrate treatment apparatus 1 according to a first embodiment of the present invention. FIG. 2 is a plan view illustrating a liquid droplet nozzle 5 and an associated arrangement according to the first embodiment of the present invention.

The substrate treatment apparatus 1 is of a single substrate treatment type which is adapted to treat a single round substrate W (e.g., a semiconductor wafer) at a time. The substrate treatment apparatus 1 includes a spin chuck 2 (substrate holding unit, rotation unit) which horizontally holds and rotates the substrate W, a tubular cup 3 surrounding the spin chuck 2, a rinse liquid nozzle 4 which supplies a rinse liquid to the substrate W, a liquid droplet nozzle 5 which causes droplets of a treatment liquid to impinge on the substrate W, a protective liquid nozzle 6 which supplies a protective liquid to the substrate W, and a controller (flow speed control unit) which controls operations of devices such as the spin chuck 2 provided in the substrate treatment apparatus 1 and the opening and the closing of valves.

The spin chuck 2 includes a spin base 8 which horizontally holds the substrate W and is rotatable about a vertical rotation axis L1 extending through a center C1 of the substrate W, and a spin motor 9 which rotates the spin base 8 about the rotation axis L1. The spin chuck 2 may be a clamp chuck adapted to horizontally clamp the substrate W to horizontally hold the substrate W or a vacuum chuck adapted to suck a back surface (lower surface) of the substrate W serving as a non-device-formation surface to horizontally hold the substrate W. In the first embodiment, the spin chuck 2 is the clamp chuck.

The rinse liquid nozzle 4 is connected to a rinse liquid supply pipe 11 provided with a rinse liquid valve 10. With the rinse liquid valve 10 open, the rinse liquid is spouted from the rinse liquid nozzle 4 toward a center portion of the upper surface of the substrate W. With the rinse liquid valve 10 closed, on the other hand, the spouting of the rinse liquid from the rinse liquid nozzle 4 is stopped. Examples of the rinse liquid to be supplied to the rinse liquid nozzle 4 include pure water (deionized water), carbonated water, electrolytically ionized water, hydrogen water, ozone water and a diluted hydrochloric acid aqueous solution (e.g., having a concentration of about 10 to about 100 ppm).

The liquid droplet nozzle 5 is an ink jet nozzle adapted to spout a multiplicity of liquid droplets by an inkjet method. The liquid droplet nozzle 5 is connected to a treatment liquid supply mechanism 13 through a treatment liquid supply pipe 12. The liquid droplet nozzle 5 is further connected to a treatment liquid drain pipe 15 provided with a drain valve 14. The treatment liquid supply mechanism 13 includes, for example, a pump. The treatment liquid supply mechanism 13 constantly supplies the treatment liquid to the liquid droplet nozzle 5 at a predetermined pressure (e.g., not higher than 10 MPa). Examples of the treatment liquid to be supplied to the liquid droplet nozzle 5 include pure water, carbonated water and SC-1 (a liquid mixture containing $NH_4OH$ and $H_2O_2$). The controller 7 controls the treatment liquid supply mechanism 13 to change the pressure of the treatment liquid to be supplied to the liquid droplet nozzle 5 to any pressure level.

As shown in FIG. 1, the liquid droplet nozzle 5 includes a piezo element 16 disposed therein. The piezo element 16 is connected to a voltage application mechanism 18 via a wiring 17. The voltage application mechanism 18 includes, for example, an inverter. The voltage application mechanism 18 applies an AC voltage to the piezo element 16. When the AC voltage is applied to the piezo element 16, the piezo element 16 oscillates at a frequency corresponding to the frequency of the AC voltage. The controller 7 controls the voltage application mechanism 18, whereby the frequency of the AC voltage to be applied to the piezo element 16 is changed to a given frequency (e.g., several hundreds KHz to several MHz). Therefore, the oscillation frequency of the piezo element 16 is controlled by the controller 7.

The substrate treatment apparatus 1 further includes a nozzle movement mechanism 19 (nozzle movement unit). The nozzle movement mechanism 19 includes a nozzle arm 20 which holds the liquid droplet nozzle 5, a pivot mechanism 21 (arm movement unit) connected to the nozzle arm 20, and a lift mechanism 22 connected to the pivot mechanism 21. The pivot mechanism 21 includes, for example, a motor. The lift mechanism 22 includes, for example, a ball screw mechanism, and a motor which drives the ball screw mechanism. The pivot mechanism 21 pivots the nozzle arm 20 about a vertical rotation axis L2 provided adjacent the spin chuck 2. The liquid droplet nozzle 5 is pivotal about the rotation axis L2 together with the nozzle arm 20. Thus, the liquid droplet nozzle 5 is horizontally moved. On the other hand, the lift mechanism 22 vertically moves up and down the pivot mechanism 21. The liquid droplet nozzle 5 and the nozzle arm 20 are vertically moved up and down together with the pivot mechanism 21. Thus, the liquid droplet nozzle 5 is vertically moved.

The pivot mechanism 21 horizontally moves the liquid droplet nozzle 5 within a horizontal plane above the spin chuck 2. As shown in FIG. 2, the pivot mechanism 21 horizontally moves the liquid droplet nozzle 5 along an arcuate path X1 extending generally parallel to the upper surface of the substrate W held by the spin chuck 2. The path X1 is a curved path which extends between two positions not overlapping the upper surface of the substrate W as seen perpendicularly (vertically) to the upper surface of the substrate W held by the spin chuck 2 and extends through the center C1 of the upper surface of the substrate W as seen vertically. When the lift mechanism 22 moves down the liquid droplet nozzle 5 from above the substrate W held by the spin chuck 2, the liquid droplet nozzle 5 approaches the upper surface of the substrate W. For the impingement of the treatment liquid droplets on the substrate W, the controller 7 controls the pivot mechanism 21 to horizontally move the liquid droplet nozzle 5 along the path X1 with the liquid droplet nozzle 5 located adjacent the upper surface of the substrate W.

The protective liquid nozzle 6 is held by the nozzle arm 20. When the nozzle arm 20 is moved by at least one of the pivot mechanism 21 and the lift mechanism 22, the liquid droplet nozzle 5 and the protective liquid nozzle 6 are moved in a predetermined positional relationship. Therefore, the protective liquid nozzle 6 is horizontally moved along the path X1 together with the liquid droplet nozzle 5 when the nozzle arm 20 is pivoted by the pivot mechanism 21. As shown in FIG. 1, the protective liquid nozzle 6 is connected to a protective liquid supply pipe 25 provided with a protective liquid valve 23 and a flow rate adjusting valve 24. With the protective liquid valve 23 open, the protective liquid is spouted from the protective liquid nozzle 6 toward the upper surface of the substrate W. With the protective liquid valve closed, on the other hand, the spouting of the protective liquid from the protective liquid nozzle 6 is stopped. The spouting speed of the protective liquid spouted from the protective liquid nozzle 6 is changed by controlling the opening degree of the flow rate adjusting valve 24 by means of the controller 7. Examples of the protective liquid to be supplied to the protective liquid nozzle 6 include a rinse liquid and a chemical liquid such as SC-1.

Figure 3:
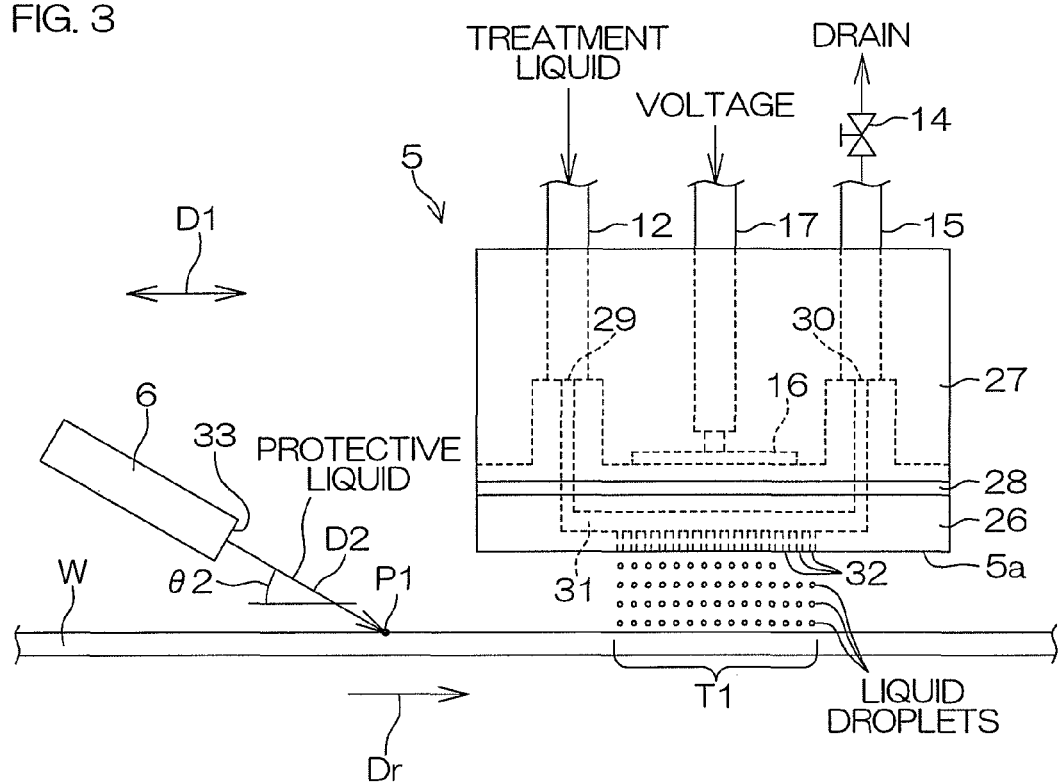
FIG. 3 is a schematic side view of the liquid droplet nozzle and a protective liquid nozzle according to the first embodiment of the present invention.
Figure 4:
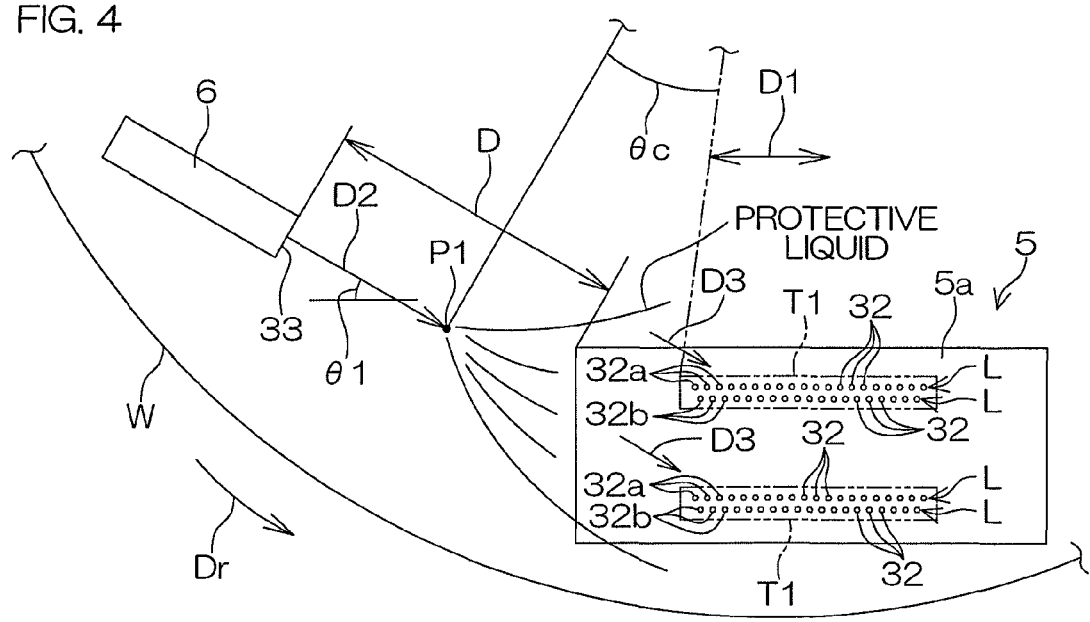
FIG. 4 is a schematic plan view of the liquid droplet nozzle and the protective liquid nozzle according to the first embodiment of the present invention.

FIG. 3 is a schematic side view of the liquid droplet nozzle 5 and the protective liquid nozzle 6 according to the first embodiment of the present invention. FIG. 4 is a schematic plan view of the liquid droplet nozzle 5 and the protective liquid nozzle 6 according to the first embodiment of the present invention. FIG. 5 is a diagram illustrating a part of FIG. 4 on a greater scale. In FIG. 4, the liquid droplet nozzle 5 is illustrated as having a lower surface 5a (opposed surface) alone. The liquid droplet nozzle 5 and the protective liquid nozzle 6 will hereinafter be described. First, the liquid droplet nozzle 5 will be described.

As shown in FIG. 3, the liquid droplet nozzle 5 includes a main body 26 which spouts the treatment liquid droplets, a cover 27 covering the main body 26, the piezo element 16 covered with the cover 27, and a seal 28 provided between the main body 26 and the cover 27. The main body 26 and the cover 27 are each made of a chemical-resistant material. The main body 26 is made of, for example, quartz. The cover 27 is made of, for example, a fluororesin. The seal 28 is made of, for example, an elastic material such as EPDM (ethylene-propylene-diene rubber). The main body 26 has a strength sufficient to withstand a high pressure. The main body 26 is partly accommodated together with the piezo element 16 in the cover 27. An end portion of the wiring 17 is connected to the piezo element 16, for example, by a solder in the cover 27. The inside of the cover 27 is sealed with the seal 28.

As shown in FIG. 3, the main body 26 includes a supply port 29 to which the treatment liquid is supplied, a drain port 30 from which the treatment liquid supplied to the supply port 29 is drained, a treatment liquid flow passage 31 which connects the supply port 29 and the drain port 30, and a plurality of spouts 32 connected to the treatment liquid flow passage 31. The treatment liquid flow passage 31 is provided in the main body 26. The supply port 29, the drain port 30 and the spouts 32 are open in surfaces of the main body 26. The supply port 29 and the drain port 30 are located at a higher level than the spouts 32. The lower surface 5a of the main body 26 is, for example, a horizontal flat surface. The spouts 32 are open in the lower surface 5a of the main body 26. The spouts 32 are minute openings each having a diameter of, for example, several μm to several tens μm. The treatment liquid supply pipe 12 and the treatment liquid drain pipe 15 are connected to the supply port 29 and the drain port 30, respectively.

As shown in FIG. 4, the spouts 32 are aligned in a plurality of lines (e.g., four lines) L. A multiplicity of spouts 32 (e.g., ten or more spouts) are equidistantly aligned in each of the lines L. The lines L each linearly extend horizontally in a longitudinal direction D1. The lines L are not necessarily required to be linear, but may be curved. The four lines L are parallel to each other. Two of the four lines L are located adjacent each other with respect to a horizontal direction perpendicular to the longitudinal direction D1. Similarly, the other two lines L are also located adjacent each other with respect to the horizontal direction perpendicular to the longitudinal direction D1. The each two adjacent lines L are paired. The spouts 32 aligned in one of the paired two lines L (spouts 32a in FIG. 4) are longitudinally (in the longitudinal direction D1) offset from the spouts 32 aligned in the other of the paired two lines L (spouts 32b in FIG. 4). The liquid droplet nozzle 5 is retained by the nozzle arm 20, for example, so that the four lines L cross the path X1 as seen vertically (see FIG. 2).

The treatment liquid supply mechanism 13 (see FIG. 1) constantly supplies the treatment liquid to the liquid droplet nozzle 5 at a high pressure. The treatment liquid supplied to the supply port 29 from the treatment liquid supply mechanism 13 through the treatment liquid supply pipe 12 is supplied to the treatment liquid flow passage 31. With the drain valve 14 closed, the pressure (liquid pressure) of the treatment liquid is high in the treatment liquid flow passage 31. Therefore, the treatment liquid is spouted from the spouts 32 by the liquid pressure with the drain valve 14 closed. When the AC voltage is applied to the piezo element 16 with the drain valve 14 closed, the treatment liquid flowing through the treatment liquid flow passage 31 is vibrated by the oscillation of the piezo element 16, and the treatment liquid spouted from the spouts 32 is fragmented by the vibration. When the AC voltage is applied to the piezo element 16 with the drain valve 14 closed, therefore, the treatment liquid is spouted from the spouts 32 in the form of droplets. Thus, multiple treatment liquid droplets having a uniform diameter are simultaneously spouted at a uniform spouting speed.

With the drain valve 14 open, on the other hand, the treatment liquid supplied to the treatment liquid flow passage 31 is drained into the treatment liquid drain pipe 15 from the drain port 30. That is, the treatment liquid supplied to the treatment liquid flow passage 31 is not spouted from the minute spouts 32 but drained into the treatment liquid drain pipe 15 from the drain port 30, because the liquid pressure in the treatment liquid flow passage 31 is not sufficiently high with the drain valve 14 open. Therefore, the spouting of the treatment liquid from the spouts 32 is controlled by the opening and the closing of the drain valve 14. The controller 7 keeps the drain valve 14 open when the liquid droplet nozzle 5 is not used for the treatment of the substrate W (when the liquid droplet nozzle 5 is in standby). Even if the liquid droplet nozzle 5 is in standby, the treatment liquid continuously flows in the liquid droplet nozzle 5.

For the impingement of the treatment liquid droplets on the upper surface of the substrate W, the controller 7 causes the nozzle movement mechanism 19 (see FIG. 1) to move the liquid droplet nozzle 5, whereby the lower surface 5a of the liquid droplet nozzle 5 (the lower surface 5a of the main body 26) is moved closer to the upper surface of the substrate W. Then, the controller 7 closes the drain valve 14 with the lower surface 5a of the liquid droplet nozzle 5 opposed to the upper surface of the substrate W to increase the internal pressure of the treatment liquid flow passage 31, and drives the piezo element 16 to vibrate the treatment liquid in the treatment liquid flow passage 31. Thus, multiple treatment liquid droplets having a uniform diameter are simultaneously spouted at a uniform spouting speed. Then, as shown in FIGS. 3 and 4, the multiple liquid droplets spouted from the liquid droplet nozzle 5 are sprayed on two spouting regions T1 on the upper surface of the substrate W. That is, one of the spouting regions T1 is located immediately below a corresponding one of the two pairs of lines L, and treatment liquid droplets spouted from the spouts 32 aligned in these paired lines L are sprayed on the one spouting region T1. Similarly, the other spouting region T1 is located immediately below the other pair of lines L, and treatment liquid droplets spouted from the spouts 32 aligned in these paired lines L are sprayed on the other spouting region T1. As shown in FIG. 4, the spouting regions T1 each have a rectangular shape extending longitudinally (in the longitudinal direction D1) as seen in plan, and these two spouting regions T1 are parallel to each other.

Next, the protective liquid nozzle 6 will be described.

The protective liquid nozzle 6 has a spout 33 from which the protective liquid is spouted. The spout 33 is located at a lower level than an upper end of the liquid droplet nozzle 5. The spout 33 has, for example, a round shape. The shape of the spout 33 is not limited to the round shape, but may be an oval shape or a slit shape. The protective liquid nozzle 6 spouts the protective liquid from the spout 33 toward a target position P1 on the substrate W in a spouting direction D2. The target position P1 is located upstream of the spouting regions T1 with respect to the rotation direction Dr of the substrate W. The target position P1 is defined so that a center angle θc (see FIG. 4), i.e., an angle defined between a line extending from the center of the upper surface of the substrate W to the spouting regions T1 and a line extending from the center of the upper surface of the substrate W to the target position P1, is not greater than 90 degrees, for example. The spouting direction D2 is a direction extending from the spout 33 to the target position P1 and extending from the spout 33 toward the liquid droplet nozzle 5 as seen in plan. The spouting direction D2 is tilted with respect to the longitudinal direction D1. An angle θ1 defined between the longitudinal direction D1 and the spouting direction D2 as seen in plan (see FIG. 4) is, for example, 25 to 35 degrees, preferably 30 degrees.

The protective liquid nozzle 6 and the liquid droplet nozzle 5 are spaced from each other. Where the spout 33 is located at a height of 2 mm as measured from the upper surface of the substrate W, a distance D measured from the protective liquid nozzle 6 (spout 33) to the liquid droplet nozzle 5 in the spouting direction D2 (see FIG. 4) as seen in plan is, for example, 15 to 40 mm, preferably 15 to 20 mm, more preferably 20 mm. As shown in FIG. 3, the spouting direction D2 is tilted with respect to the vertical direction toward the spouting regions T1. That is, the target position P1 is offset toward the spouting regions T1 in a horizontal direction with respect to the spout 33 as seen in plan, and the spouting direction D2 is tilted with respect to the upper surface of the substrate W. An angle θ2 defined between the upper surface of the substrate W and the spouting direction D2 (see FIG. 3) is, for example, 10 to 40 degrees, preferably 30 degrees.

As shown in FIG. 3, the protective liquid spouted from the protective liquid nozzle 6 impinges on the substrate W at the target position P1 to be deflected, and spreads on the substrate W to flow toward the spouting regions T1 on the upper surface of the substrate W. Thus, the protective liquid flows into a space defined between the liquid droplet nozzle 5 and the upper surface of the substrate W to be supplied to the spout regions T1. Since the spouting direction D2 is tilted with respect to the vertical direction, the protective liquid spreads in a relatively small area on the substrate W. That is, where the spouting direction D2 extends vertically, the protective liquid spreads radially from the target position P1. In contrast, where the spouting direction D2 is tilted, the protective liquid spreads in a triangular area having vertexes one of which is defined by the target position P1. Therefore, the flow rate of the supplied protective liquid observed at a given position on the substrate W is higher than that observed when the spouting direction D2 extends vertically. Accordingly, the protective liquid is supplied to the spouting regions T1 at a higher flow rate than when the spouting direction D2 extends vertically. Further, the protective liquid is deflected to be decelerated at a lower deceleration rate and, hence, supplied to the spouting regions T1 at a higher flow rate than when the spouting direction D2 extends vertically.

The controller 7 causes the protective liquid nozzle 6 to spout the protective liquid, while causing the spin chuck 2 to rotate the substrate W. Since the protective liquid is supplied to the rotating substrate W, the protective liquid supplied to the substrate W is accelerated radially (in a rotation radial direction) due to contact with the substrate W and accelerated in the rotation direction Dr of the substrate W. Therefore, the protective liquid supplied to the substrate W radially spreads from the target position P1 while flowing in the rotation direction. Since the target position P1 is located upstream of the spouting regions T1 with respect to the rotation direction Dr of the substrate W, the protective liquid accelerated in the rotation direction Dr between the target position P1 and the spouting regions T1 is supplied to the spouting regions T1. Therefore, the protective liquid is supplied to the spouting regions T1 at a higher flow speed than the flow speed of the protective liquid spouted from the protective liquid nozzle 6.

Since the spouting direction D2 is tilted with respect to the longitudinal direction D1 as seen in plan, the protective liquid spouted from the protective liquid nozzle 6 flows obliquely into the spouting regions T1 (as indicated by an oblique direction D3 in FIG. 4). Therefore, the protective liquid flowing into the spouting regions T1 passes obliquely across the spouting regions T1. Accordingly, a path along which the protective liquid passes across the spouting regions T1 is shorter than a path along which the protective liquid passes longitudinally (in the longitudinal direction D1) across the spouting regions T1. With the treatment liquid droplets being sprayed on the spouting regions T1, the protective liquid flowing into the spouting regions T1 is prevented from flowing on by the treatment liquid droplets. If the path is longer, there is a possibility that the protective liquid cannot reach the end of the path. That is, there is a possibility that the protective liquid cannot be supplied to the entire spouting regions T1. By shortening the path of the protective liquid, therefore, the protective liquid can be reliably supplied to the entire spouting regions T1. Further, the protective liquid is directly supplied to positions (impingement positions) at which the treatment liquid droplets spouted from the spouts 32 impinge on the substrate W, because the protective liquid flows obliquely into the spouting regions T1. That is, as shown in FIG. 5, the impingement positions of the liquid droplets spouted from the respective spouts 32 are each supplied with a stream of the protective liquid not passing through the other impingement positions. Therefore, streams of the protective liquid, which are not decelerated by the encounter with the liquid droplets, are supplied to the impingement positions of the liquid droplets spouted from the respective spouts 32.

FIGS. 6A to 6D are diagrams for explaining an exemplary substrate treatment process to be performed by the substrate treatment apparatus 1 according to the first embodiment of the present invention.

An untreated substrate W is transported by a transport robot not shown, and placed on the spin chuck 2, for example, with its front surface (device formation surface) up. Then, the controller 7 causes the spin chuck 2 to hold the substrate W. Thereafter, the controller 7 controls the spin motor 9 to rotate the substrate W held by the spin chuck 2.

Subsequently, deionized water is supplied as an example of the rinse liquid to the substrate W from the rinse liquid nozzle 4 to perform a first covering step to cover an upper surface of the substrate W with the deionized water. More specifically, the controller 7 causes the spin chuck 2 to rotate the substrate W, and opens the rinse liquid valve 10 to spout the deionized water from the rinse liquid nozzle 4 toward a center portion of the upper surface of the substrate W held by the spin chuck 2 as shown in FIG. 6A. The deionized water spouted from the rinse liquid nozzle 4 is supplied to the upper surface center portion of the substrate W, and receives a centrifugal force generated by the rotation of the substrate W to spread outward on the upper surface of the substrate W. Thus, the deionized water is supplied to the entire upper surface of the substrate W to form a deionized water film covering the entire upper surface of the substrate W. After a lapse of a predetermined period from the opening of the rinse liquid valve 10, the controller 7 closes the rinse liquid valve 10 to stop spouting the deionized water from the rinse liquid nozzle 4.

Then, a cleaning step is performed to supply droplets of carbonated water as an example of the treatment liquid from the liquid droplet nozzle 5 to the substrate W to clean the substrate W and, at the same time, a second covering step is performed to supply SC-1 as an example of the protective liquid from the protective liquid nozzle 6 to the substrate W to cover the upper surface of the substrate W with the SC-1. More specifically, the controller 7 controls the nozzle movement mechanism 19 to move the liquid droplet nozzle 5 and the protective liquid nozzle 6 to above the spin chuck 2 and locate the lower surface 5a of the liquid droplet nozzle 5 close to the upper surface of the substrate W. Thereafter, the controller 7 causes the spin chuck 2 to rotate the substrate W and, at the same time, opens the protective liquid valve 23 to spout the SC-1 from the protective liquid nozzle 6 as shown in FIG. 6B. Before the SC-1 is spouted from the protective liquid nozzle 6, the controller 7 adjusts the opening degree of the flow rate adjusting valve 24 so as to spout the SC-1 from the protective liquid nozzle 6 at a spouting speed of not less than 1.6 m/s. Thus, the SC-1 is spouted from the protective liquid nozzle 6 at a spouting speed of not less than 1.6 m/s. Then, the SC-1 spouted from the protective liquid nozzle 6 is supplied to the entire spouting regions T1. Thus, a SC-1 film is formed, which covers the entire spouting regions T1 (see FIG. 13).

Simultaneously with the spouting of the SC-1 from the protective liquid nozzle 6, the controller 7 causes the liquid droplet nozzle 5 to spout the carbonated water droplets. More specifically, the controller 7 closes the drain valve 14 with the lower surface 5a of the liquid droplet nozzle 5 being located adjacent the upper surface of the substrate W and with the SC-1 being spouted from the protective liquid nozzle 6, and causes the voltage application mechanism 18 to apply the AC voltage to the piezo element 16 of the liquid droplet nozzle 5 at a predetermined frequency. Further, as shown in FIG. 6B, the controller 7 causes the nozzle movement mechanism 19 to reciprocate the liquid droplet nozzle 5 along the path X1 between the center position Pc and a peripheral edge position Pe several times (half-scanning operation), while rotating the substrate W at a constant rotation speed and spouting the SC-1 from the protective liquid nozzle 6 at a constant speed (at the predetermined spouting speed described above). As indicated by a solid line in FIG. 2, the center position Pc is a position at which the liquid droplet nozzle 5 overlaps the upper surface center portion of the substrate W as seen in plan. As indicated by a two-dot-and-dash line in FIG. 2, the peripheral edge position Pe is a position at which the liquid droplet nozzle 5 overlaps a peripheral edge portion of the upper surface of the substrate W as seen in plan.

A multiplicity of carbonated water droplets are spouted downward from the liquid droplet nozzle 5 to be thereby sprayed on the spouting regions T1 covered with the SC-1 film. Further, the controller 7 moves the liquid droplet nozzle 5 between the center position Pc and the peripheral edge position Pe while rotating the substrate W. Thus, the upper surface of the substrate W is scanned with the spouting regions T1, so that the spouting regions T1 pass over the entire upper surface of the substrate W. In this manner, the carbonated water droplets are sprayed on the entire upper surface of the substrate W, whereby foreign matter such as particles adhering to the upper surface of the substrate W is physically removed by the impingement of the liquid droplets on the substrate W. Further, a bonding force between the foreign matter and the substrate W is reduced by partly dissolving the substrate W, whereby the foreign matter is reliably removed. The carbonated water droplets are sprayed on the spouting regions T1 with the entire upper surface of the substrate W covered with the liquid film, so that the foreign matter once removed from the substrate W is substantially prevented from adhering again onto the substrate W. Thus, the cleaning step is performed simultaneously with the second covering step. After the cleaning step and the second covering step are performed for a predetermined period, the controller 7 opens the drain valve 14 and stops spouting the liquid droplets from the liquid droplet nozzle 5. Further, the controller 7 closes the protective liquid valve 23 to spot spouting the SC-1 from the protective liquid nozzle 6.

Subsequently, a rinsing step is performed to supply pure water as an example of the rinse liquid from the rinse liquid nozzle 4 to the substrate W to wash away liquid and foreign matter adhering to the substrate W. More specifically, the controller 7 opens the rinse liquid valve 10 to spout the deionized water from the rinse liquid nozzle 4 to the upper surface center portion of the substrate W held by the spin chuck 2 as shown in FIG. 6C, while causing the spin chuck 2 to rotate the substrate W. The deionized water spouted from the rinse liquid nozzle 4 is supplied to the upper surface center portion of the substrate W, and receives a centrifugal force generated by the rotation of the substrate W to spread outward on the substrate W. Thus, the deionized water is supplied to the entire upper surface of the substrate W to wash away the liquid and the foreign matter adhering to the substrate W. After a lapse of a predetermined period from the opening of the rinse liquid valve 10, the controller 7 closes the rinse liquid valve 10 to stop spouting the deionized water from the rinse liquid nozzle 4.

Then, a drying step (spin-drying step) is performed to dry the substrate W. More specifically, the controller 7 controls the spin motor 9 to rotate the substrate W at a higher rotation speed (e.g., several thousands rpm). Thus, the deionized water adhering to the substrate W is subjected to a greater centrifugal force to be thereby spun around the substrate W as shown in FIG. 6D. In this manner, the deionized water is removed from the substrate W, so that the substrate W is dried. After the drying step is performed for a predetermined period, the controller 7 controls the spin motor 9 to cause the spin chuck 2 to stop rotating the substrate W. Thereafter, the substrate W thus treated is unloaded from the spin chuck 2 by the transport robot.

Figure 7:
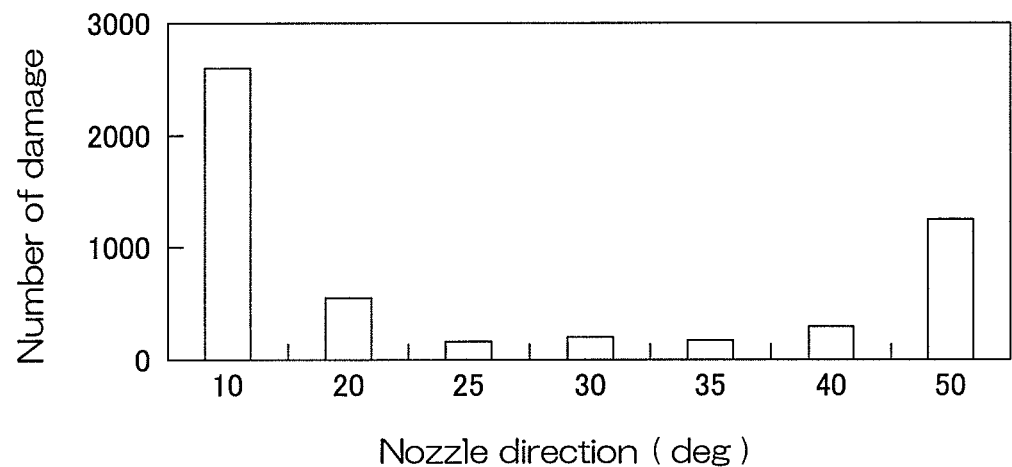
FIG. 7 is a graph showing a relationship between a spouting direction and the number of damages to a substrate.

FIG. 7 is a graph showing a relationship between the spouting direction D2 and the number of damages to the substrate W.

The numbers of damages shown in FIG. 7 are measurements obtained when substrates were treated under the same conditions except for the angle $\theta 1$ defined between the longitudinal direction D1 and the spouting direction D2 as seen in plan. Where the angle $\theta 1$ was 10 degrees or 50 degrees in a range of 10 to 50 degrees, as shown in FIG. 7, a greater number of damages were observed. Though not shown, the liquid droplets were splashed like mist downstream between the lower surface 5a of the liquid droplet nozzle 5 and the upper surface of the substrate W when the angle $\theta 1$ was 10 degrees or 50 degrees. The splash occurred supposedly because of a lack of the protective liquid without sufficient supply of the protective liquid to the entire spouting regions T1. That is, the splash occurred supposedly because the spouting regions T1 were not entirely covered with the protective liquid film. When the angle $\theta 1$ was in a range of 20 to 40 degrees, a smaller number of damages were observed without the splash. When the angle $\theta 1$ was in a range of 25 to 35 degrees, a smaller number of damages were observed than when the angle $\theta 1$ was 20 degrees or 40 degrees. Therefore, the angle $\theta 1$ defined between the longitudinal direction D1 and the spouting direction D2 as seen in plan is preferably 25 to 35 degrees, more preferably 30 degrees.

Figure 8:
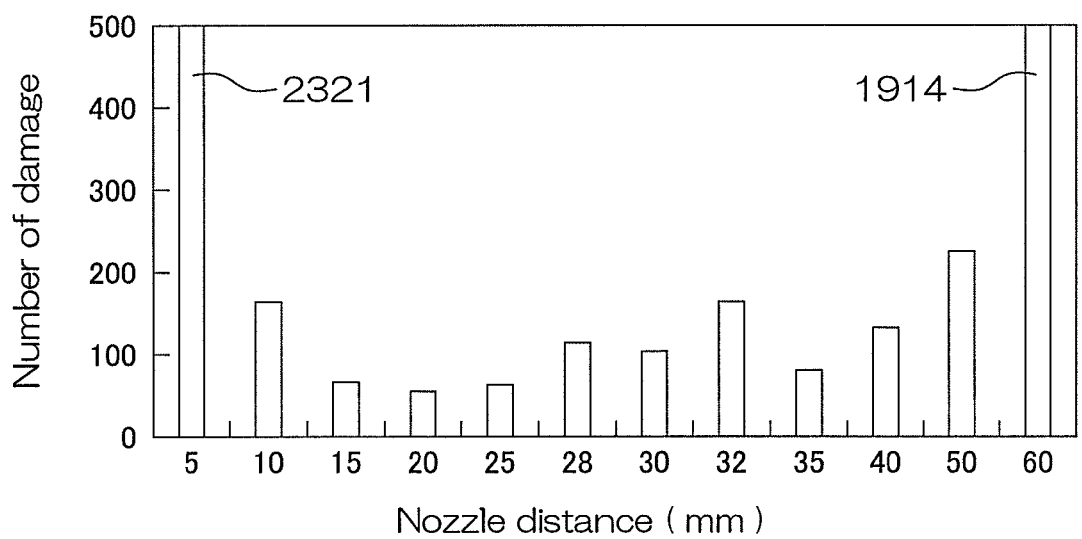
FIG. 8 is a graph showing a relationship between a distance measured from the protective liquid nozzle to the liquid droplet nozzle in the spouting direction as seen in plan and the number of damages to the substrate.

FIG. 8 is a graph showing a relationship between the distance D measured from the protective liquid nozzle 6 to the liquid droplet nozzle 5 in the spouting direction D2 as seen in plan and the number of damages to the substrate W.

The numbers of damages shown in FIG. 8 are measurements obtained when substrates W were treated under the same conditions except for the distance D. When the distance D was 5 mm or 60 mm in a range of 5 to 60 mm, as shown in FIG. 8, a greater number of damages were observed with the splash. When the distance D was in a range of 10 to 40 mm, a smaller number of damages were observed without the splash. When the distance D was in a range of 15 to 25 mm, a further smaller number of damages were observed. Therefore, the distance D measured from the protective liquid nozzle 6 to the liquid droplet nozzle 5 in the spouting direction D2 is preferably 15 to 40 mm, more preferably 15 to 25 mm, particularly preferably 20 mm.

Figure 9:
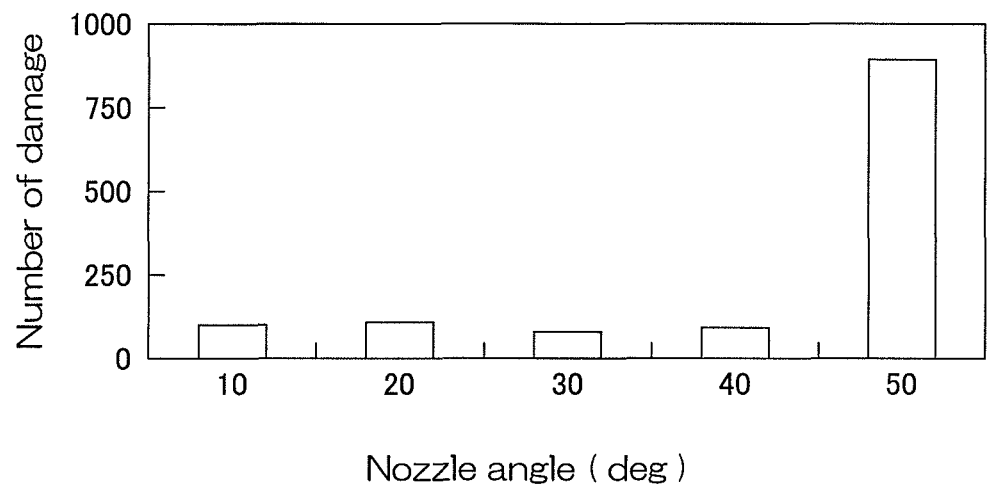
FIG. 9 is a graph showing a relationship between an angle defined between the upper surface of the substrate and the spouting direction and the number of damages to the substrate.

FIG. 9 is a graph showing a relationship between the angle $\theta 2$ defined between the upper surface of the substrate W and the spouting direction D2 and the number of damages to the substrate W.

The numbers of damages shown in FIG. 9 are measurements obtained when substrates W were treated under the same conditions except for the angle $\theta 2$. When the angle $\theta 2$ was 50 degrees in a range of 10 to 50 degrees, as shown in FIG. 9, a greater number of damages were observed with splash. When the angle $\theta 2$ was in a range of 10 to 40 degrees, a smaller number of damages were observed without the splash. When the angle $\theta 2$ was 30 degrees, the smallest number of damages were observed. Therefore, the angle $\theta 2$ defined between the upper surface of the substrate W and the spouting direction D2 is preferably 10 to 40 degrees, particularly preferably 30 degrees.

Figure 10:
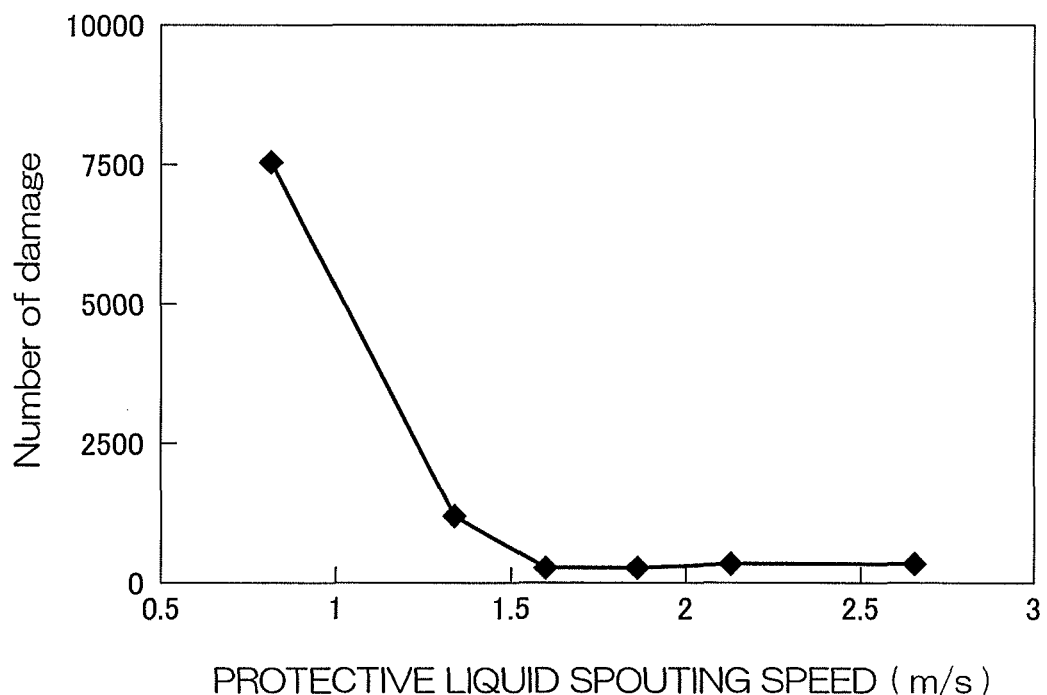
FIG. 10 is a graph showing a relationship between the spouting speed of a protective liquid spouted from the protective liquid nozzle and the number of damages to the substrate.

FIG. 10 is a graph showing a relationship between the spouting speed of the protective liquid spouted from the protective liquid nozzle 6 and the number of damages to the substrate W.

The numbers of damages shown in FIG. 10 are measurements obtained when substrates W were treated under the same conditions except for the spouting speed of the protective liquid spouted from the protective liquid nozzle 6. When the spouting speed of the protective liquid was not lower than 1.3 m/s in a range of 0.8 to 2.7 m/s, as shown in FIG. 10, a smaller number of damages were observed. When the spouting speed of the protective liquid was in a range of 1.6 to 2.7 m/s, a smaller number of damages were observed than when the spouting speed of the protective liquid was 1.3 m/s. The measurement results shown in FIG. 10 indicate that the number of damages observed when the spouting speed of the protective liquid was higher than 2.7 m/s was substantially equal to that observed when the spouting speed of the protective liquid was in a range of 1.6 to 2.7 m/s. Therefore, the spouting speed of the protective liquid spouted from the protective liquid nozzle 6 is preferably not lower than 1.6 m/s. In this case, an upper limit of the spouting speed of the protective liquid may be 13 m/s. That is, the spouting speed of the protective liquid may be determined so that the flow speed of the protective liquid flowing on the substrate W is not less than 1.6 m/s, more specifically, 1.6 to 13 m/s.

Figure 11:
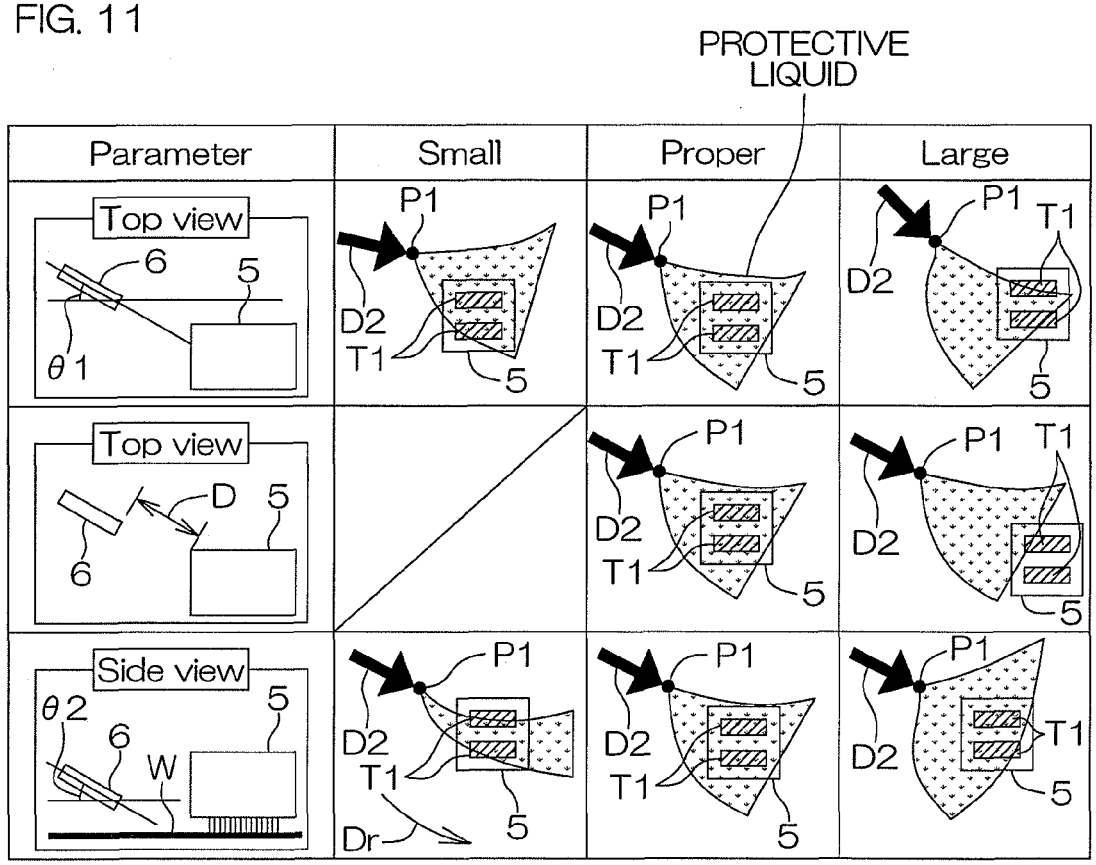
FIG. 11 is a schematic plan view for explaining how the protective liquid is supplied to a spouting region when the protective liquid is spouted from the protective liquid nozzle toward a rotating substrate.
Figure 12:
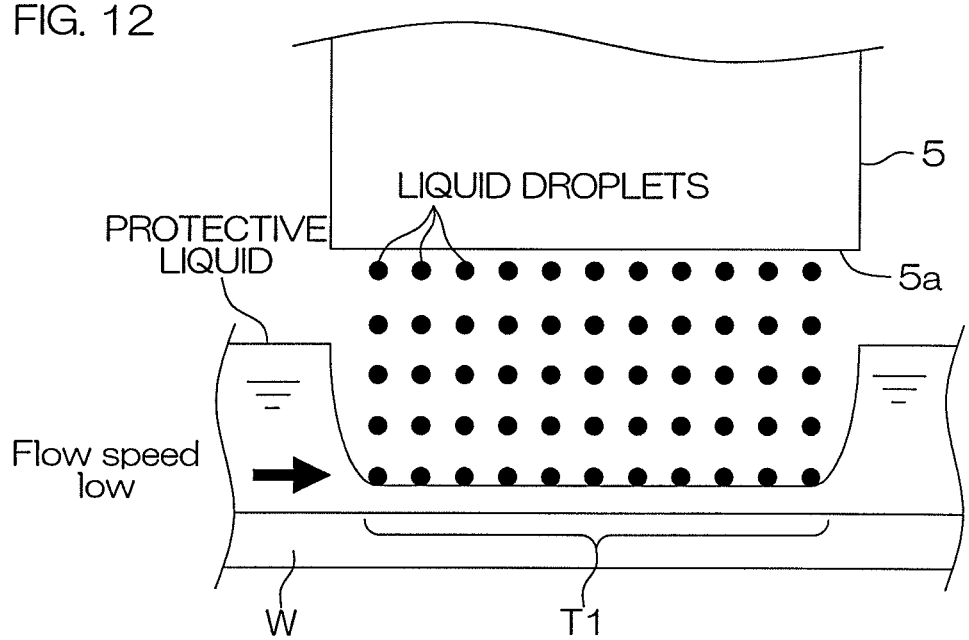
FIG. 12 is a schematic side view for explaining a protective liquid supply state observed when the protective liquid flows toward the spouting region at a lower flow speed.
Figure 13:
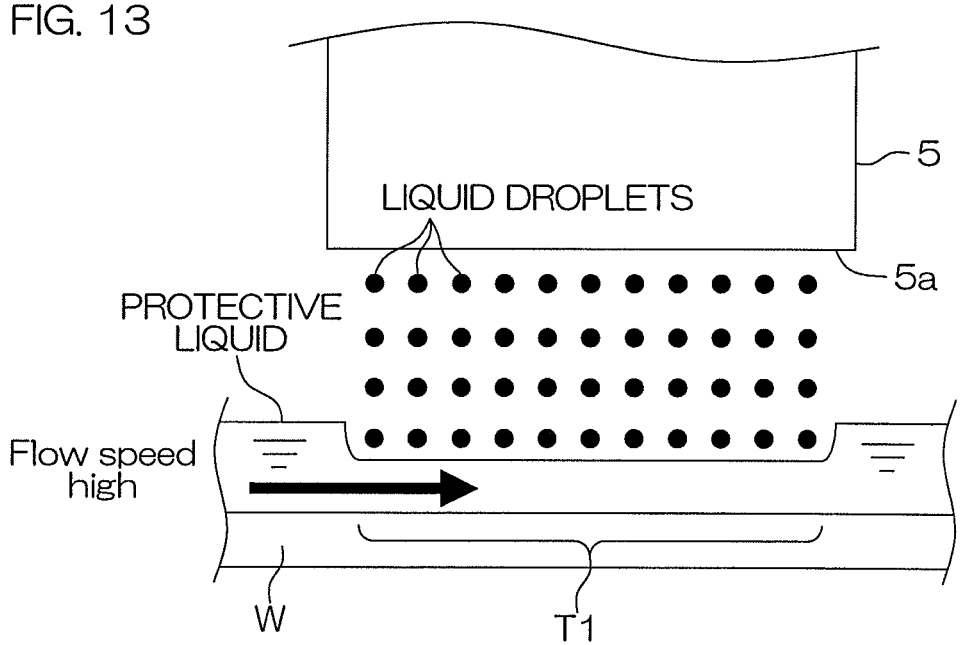
FIG. 13 is a schematic side view for explaining a protective liquid supply state observed when the protective liquid flows toward the spouting region at a higher flow speed.
Figure 14:
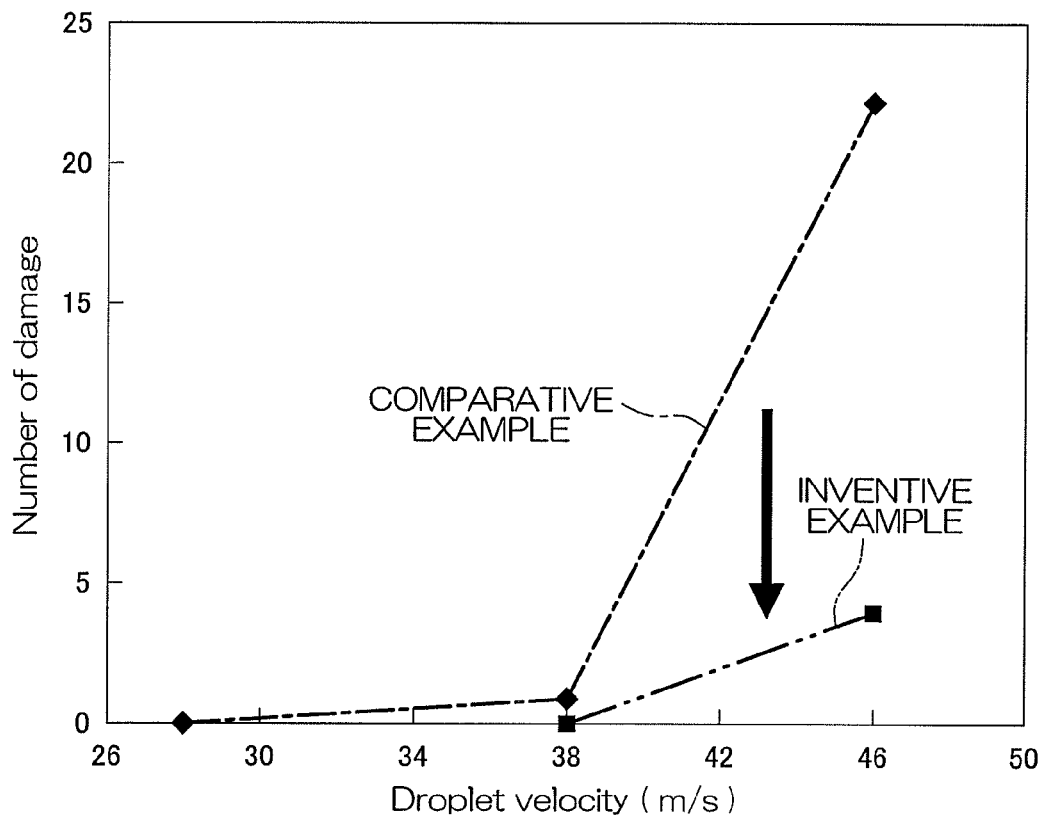
FIG. 14 is a graph showing a relationship between the spouting speed of liquid droplets spouted from the liquid droplet nozzle and the number of damages to the substrate.

FIG. 11 is a schematic plan view for explaining how the protective liquid is supplied to the spouting regions T1 when the protective liquid is spouted from the protective liquid nozzle 6 toward the rotating substrate W. FIG. 12 is a schematic side view for explaining a protective liquid supply state observed when the protective liquid flows toward the spouting regions T1 at a lower flow speed. FIG. 13 is a schematic side view for explaining a protective liquid supply state observed when the protective liquid flows toward the spouting regions T1 at a higher flow speed. FIG. 14 is a graph showing a relationship between the spouting speed of the liquid droplets spouted from the liquid droplet nozzle 5 and the number of damages to the substrate W. In the following description, reference will be made to FIG. 11. Reference will be also made to FIGS. 12 to 14 as required.

Three supply states shown in an upper portion of FIG. 11 are supply states observed when only the angle $\theta 1$ defined between the longitudinal direction D1 and the spouting direction D2 as seen in plan was changed and the distance D and the angle $\theta 2$ were each set at a proper value. Where the angle $\theta 1$ is proper (25 to 35 degrees), as shown in the upper portion of FIG. 11, the protective liquid is supplied to the entire spouting regions T1. Where the angle $\theta 1$ is smaller or greater than the proper range, on the other hand, a protective liquid spreading area on the substrate W does not cover the entire spouting regions T1, making it impossible to supply the protective liquid to the entire spouting regions T1. Therefore, the treatment liquid droplets are sprayed on an area of the substrate W not covered with the protective liquid film.

Two supply states shown in an intermediate portion of FIG. 11 are supply states observed when only the distance D measured from the protective liquid nozzle 6 to the liquid droplet nozzle 5 in the spouting direction D2 as seen in plan was changed and the angle $\theta 1$ and the angle $\theta 2$ were each set at a proper value. Where the distance D is proper (15 to 40 mm), as shown in the intermediate portion of FIG. 11, the protective liquid is supplied to the entire spouting regions T1. Where the distance D is greater than the proper range, on the other hand, the protective liquid spreads more than necessary before reaching the spouting regions T1 and, therefore, flows into the spouting regions T1 at an insufficient flow rate and at an insufficient flow speed. Accordingly, the treatment liquid droplets prevent the protective liquid from flowing into the entire spouting regions T1. Therefore, the treatment liquid droplets are sprayed on an area of the substrate W not covered with the protective liquid film.

Three supply states shown in a lower portion of FIG. 11 are supply states observed when only the angle $\theta 2$ defined between the upper surface of the substrate W and the spouting direction D2 was changed and the angle $\theta 1$ and the distance D were each set at a proper value. Where the angle $\theta 2$ is proper (10 to 40 degrees), as shown in the lower portion of FIG. 11, the protective liquid is supplied to the entire spouting regions T1. Where the angle $\theta 2$ is smaller than the proper range (the spouting direction D2 is substantially horizontal), on the other hand, the protective liquid supplied to the substrate W has a higher flow velocity in the rotation direction Dr and, therefore, moves downstream of the spouting regions T1 before sufficiently spreading radially. This makes it impossible to properly supply the protective liquid to the entire spouting regions T1. Where the angle $\theta 2$ is greater than the proper range, the protective liquid radially spreads to a greater extent and, therefore, is supplied to the spouting regions T1 at an insufficient flow rate and at an insufficient flow speed. This makes it impossible to properly supply the protective liquid to the entire spouting regions T1.

The spouting direction D2 (the angle $\theta 1$ defined between the longitudinal direction D1 and the spouting direction D2 as seen in plan), the distance D measured from the protective liquid nozzle 6 to the liquid droplet nozzle 5 in the spouting direction D2 as seen in plan and the angle $\theta 2$ defined between the upper surface of the substrate W and the spouting direction D2 are thus each set at a proper value to permit the protective liquid to flow into the spouting regions T1 at a sufficient flow speed and at a sufficient flow rate. Thus, the protective liquid film can be formed as having a sufficient film thickness to cover the entire spouting regions T1.

If the protective liquid flows at a lower flow speed on the substrate W, as shown in FIG. 12, the protective liquid flowing to the spouting regions T1 is mostly prevented from entering the spouting regions T1 by the treatment liquid droplets. Therefore, the protective liquid film covering the spouting regions T1 is hardly formed. Even if the protective liquid film is formed, the protective liquid film has a smaller thickness. If the protective liquid flows at a higher flow speed on the substrate W, as shown in FIG. 13, the protective liquid flowing to the spouting regions T1 enters the spouting regions T1 against the treatment liquid droplets. Therefore, the protective liquid film is formed as having a sufficient thickness to cover the entire spouting regions T1. That is, the entire spouting regions T1 are constantly covered with the protective liquid film when the treatment liquid droplets are sprayed on the spouting regions T1. This makes it possible to remove foreign matter such as particles from the spouting regions T1 while protecting the entire spouting regions T1 with the protective liquid.

By increasing the spouting speed of the liquid droplets spouted from the liquid droplet nozzle 5, an impact to be applied to the foreign matter by the impingement of the liquid droplets can be increased to improve the foreign matter removal percentage. However, the increase in the spouting speed of the liquid droplets spouted from the liquid droplet nozzle 5 increases an impact acting on a pattern formed on the substrate W, thereby increasing the number of damages. More specifically, where the treatment liquid droplets are caused to impinge on the spouting regions T1 without the coverage of the spouting regions T1 with the protective liquid film, as indicated by a one-dot-and-dash line in FIG. 14 (Comparative Example), the number of damages is increased as the spouting speed of the liquid droplets spouted from the liquid droplet nozzle 5 increases. Where the treatment liquid droplets are caused to impinge on the spouting regions T1 with the coverage of the spouting regions T1 with the protective liquid film, as indicated by a two-dot-and-dash line in FIG. 14 (Inventive Example), the number of damages can be reduced. With the coverage of the spouting regions T1 with the protective liquid film, therefore, the treatment liquid droplets can be spouted from the liquid droplet nozzle 5 at a higher spouting speed which may otherwise damage the substrate W without the coverage of the spouting regions T1 with the protective liquid film. This improves the foreign matter removal percentage while suppressing the damages.

In the first embodiment, as described above, the treatment liquid droplets are spouted from the liquid droplet nozzle 5 toward the upper surface of the substrate W horizontally held by the spin chuck 2. Thus, the treatment liquid droplets are sprayed on the spouting regions T1 on the upper surface of the substrate W. Simultaneously with the spouting of the treatment liquid from the liquid droplet nozzle 5, the protective liquid is spouted from the protective liquid nozzle 6 toward the upper surface of the substrate W. The protective liquid spouted from the protective liquid nozzle 6 impinges on the substrate W to be deflected, and spreads on the substrate W to flow toward the spouting regions T1 on the upper surface of the substrate W. The protective liquid spreading on the substrate W flows into the spouting regions T1 against the treatment liquid droplets sprayed on the spouting regions T1. That is, flow speed control conditions including at least one of the spouting speed of the protective liquid spouted from the protective liquid nozzle 6, the spouting direction D2 of the protective liquid spouted from the protective liquid nozzle 6, the distance D from the protective liquid nozzle 6 to the liquid droplet nozzle 5, the angle θ2 of the spouting direction with respect to the upper surface of the substrate W and the rotation speed of the substrate W are properly controlled, whereby the flow speed of the protective liquid flowing on the substrate W is controlled so that the protective liquid can flow into the spouting regions T1 against the treatment liquid droplets.

More specifically, the spouting direction D2 of the protective liquid spouted from the protective liquid nozzle 6 is tilted with respect to the upper surface of the substrate W. Therefore, the protective liquid is decelerated at a lower deceleration rate when being deflected, as compared with the case in which the spouting direction D2 is perpendicular to the upper surface of the substrate W. Accordingly, the protective liquid spouted from the protective liquid nozzle 6 reaches the spouting regions T1 at a relatively high speed. Thus, the protective liquid flows into the spouting regions T1 against the treatment liquid droplets sprayed on the spouting regions T1. The protective liquid is supplied to the spouting regions T1, and the protective liquid film is formed on the spouting regions T1 as having a sufficient thickness. Thus, the spouting regions T1 are covered with the protective liquid film serving as a protection film and, in this state, the treatment liquid droplets impinge on the spouting regions T1. This alleviates the impact to the pattern, thereby suppressing the damages to the substrate W.

Since the protective liquid spouting direction D2 is tilted with respect to the upper surface of the substrate W, the protective liquid spreads in a relatively small area on the substrate W. That is, where the spouting direction D2 is perpendicular to the upper surface of the substrate W, the protective liquid spreads radially on the substrate W. In contrast, where the spouting direction D2 is tilted with respect to the upper surface of the substrate W, the protective liquid triangularly spreads on the substrate W. Therefore, the flow rate of the supplied protective liquid observed at a given position on the substrate W is higher than that observed when the spouting direction D2 is perpendicular to the upper surface of the substrate W. Thus, the protective liquid can be supplied to the spouting regions T1 at a higher flow rate than when the spouting direction D2 is perpendicular to the upper surface of the substrate W. This increases the thickness of the liquid film covering the spouting regions T1, thereby suppressing the damages to the substrate W.

In the first embodiment, the protective liquid flowing on the upper surface of the substrate W enters the spouting regions T1 in the direction D3 extending obliquely with respect to the longitudinal direction D1 of the spouting regions T1 as seen in plan (see FIG. 4). Therefore, the protective liquid passes obliquely across the spouting regions T1. The path along which the protective liquid passes obliquely across the spouting regions T1 is shorter than the path along which the protective liquid passes longitudinally (in the longitudinal direction D1) across the spouting regions T1. The protective liquid entering the spouting regions T1 is prevented from flowing on by the treatment liquid droplets. If the path is longer, there is a possibility that the protective liquid cannot reach the end of the path. That is, there is a possibility that the protective liquid is not supplied to the entire spouting regions T1. By shortening the path of the protective liquid, therefore, the protective liquid can be reliably supplied to the entire spouting regions T1. Thus, the protective liquid film can be reliably formed as covering the entire spouting regions T1.

In the first embodiment, the protective liquid is spouted from the protective liquid nozzle 6 toward the target position P1 on the upper surface of the substrate W, while the substrate W is rotated about the vertical rotation axis L1 extending through the center of the upper surface of the substrate W. Therefore, the protective liquid spouted from the protective liquid nozzle 6 collides against the substrate W at the target position P1 to be deflected, and spreads on the substrate W to flow to the spouting regions T1. Since the protective liquid is supplied to the rotating substrate W, the protective liquid supplied to the substrate W is accelerated radially (in the rotation radial direction) due to the contact with the substrate W and accelerated in the rotation direction Dr of the substrate W. Therefore, the protective liquid supplied to the substrate W spreads radially from the target position P1 while flowing in the rotation direction.

The target position P1 is located upstream of the spouting regions T1 with respect to the rotation direction Dr of the substrate W. If the target position P1 was located downstream of the spouting regions T1, the protective liquid supplied to the target position P1 would be expelled around the substrate W before reaching the spouting regions T1. Even if the protective liquid could reach the spouting regions T1, the flow speed and the flow rate of the protective liquid flowing into the spouting regions T1 would be lower than those observed when the target position P1 is located upstream of the spouting regions T1. Therefore, the protective liquid can be reliably supplied to the spouting regions T1 by spouting the protective liquid toward the position (target position P1) upstream of the spouting regions T1 with respect to the rotation direction Dr of the substrate W. Thus, the protective liquid film can be formed as covering the spouting regions T1.

In the first embodiment, the nozzle movement mechanism 19 moves the liquid droplet nozzle 5 and the protective liquid nozzle 6 so as to move the spouting regions T1 between the center portion and the peripheral edge portion of the upper surface of the substrate W. By causing the nozzle movement mechanism 19 to move the liquid droplet nozzle 5 and the protective liquid nozzle 6 while causing the spin chuck 2 to rotate the substrate W about the rotation axis L1, the upper surface of the substrate W is scanned with the spouting regions T1, whereby the spouting regions T1 pass over the entire upper surface of the substrate W. Thus, the treatment liquid droplets impinge on the entire upper surface of the substrate W to remove the foreign matter from the substrate W. Further, the nozzle movement mechanism 19 moves the liquid droplet nozzle 5 and the protective liquid nozzle 6 while keeping the liquid droplet nozzle 5 and the protective liquid nozzle 6 in the predetermined positional relationship (e.g., in a predetermined spaced relationship or in a predetermined attitude relationship). Therefore, the protective liquid spouted from the protective liquid nozzle 6 can be reliably supplied to the target position P1. Thus, the protective liquid can reliably flow into the spouting regions T1 to form the protective liquid film covering the spouting regions T1.

Figure 15:
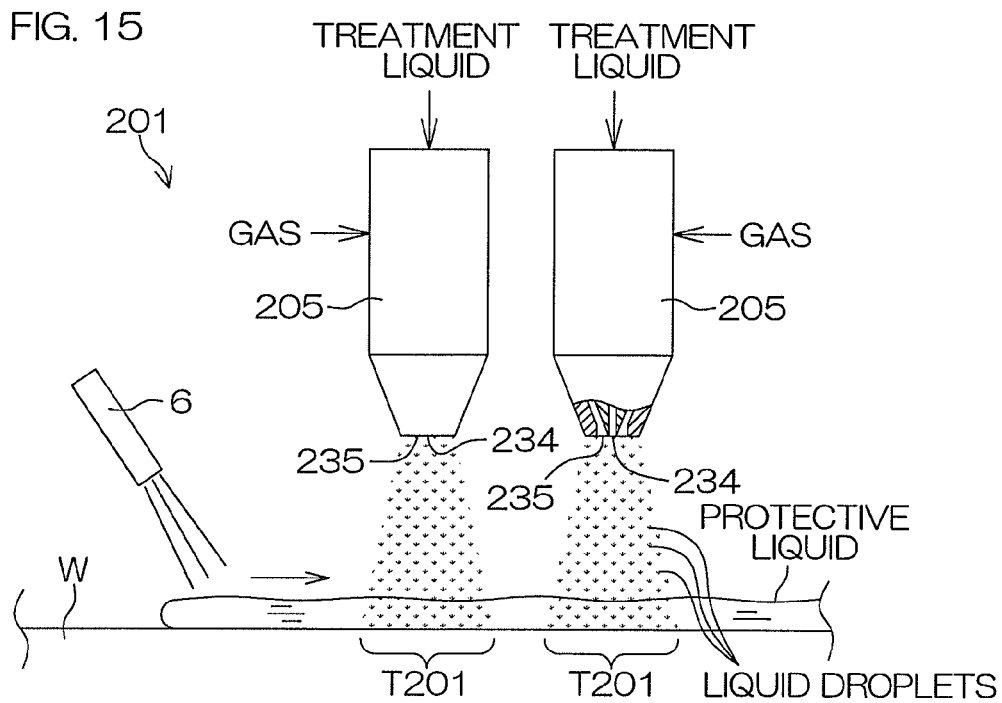
FIG. 15 is a schematic side view of a liquid droplet nozzle and a protective liquid nozzle according to a second embodiment of the present invention.

Next, a second embodiment of the present invention will be described. In FIG. 15, components corresponding to those shown in FIGS. 1 to 14 will be designated by the same reference characters as in FIGS. 1 to 14, and duplicate description will be omitted.

FIG. 15 is a schematic side view of a liquid droplet nozzle 205 and a protective liquid nozzle 6 according to the second embodiment of the present invention.

A substrate treatment apparatus 201 according to the second embodiment has substantially the same construction as the substrate treatment apparatus 1 according to the first embodiment, except for the liquid droplet nozzle. That is, the substrate treatment apparatus 201 includes liquid droplet nozzles 205, instead of the liquid droplet nozzle 5 according to the first embodiment, which generates treatment liquid droplets to be sprayed on spouting regions T201. In the second embodiment, the substrate treatment apparatus 201 includes two liquid droplet nozzles 205. The two liquid droplet nozzles 205 may be retained by a common holder or may be respectively retained by separate holders provided for the respective liquid droplet nozzles 205. In FIG. 15, the two liquid droplet nozzles 205 are illustrated as being horizontally spaced from each other (transversely on the paper face of FIG. 15), but may contact each other or unitarily bonded to each other. The number of the liquid droplet nozzles 205 is not limited to two, but may be one, or three or more.

The liquid droplet nozzles 205 are each a bifluid nozzle which mixes a liquid and a gas to generate liquid droplets. The liquid droplet nozzles 205 each include a treatment liquid spout 234 from which the treatment liquid is spouted toward the spouting region T201, and a gas spout 235 from which a gas is spouted toward the spouting region T201. The gas spout 235 has an annular shape surrounding the treatment liquid spout 234. An inert gas such as nitrogen gas is spouted as an example of the gas from the gas spout 235. The liquid droplet nozzle 205 spouts the treatment liquid from the treatment liquid spout 234 and spouts the gas from the gas spout 235 to cause the gas to collide against the treatment liquid between the liquid droplet nozzle 205 and the substrate W to generate the treatment liquid droplets. Thus, the treatment liquid droplets are sprayed on the spouting regions T201 covered with a film of a protective liquid spouted from the protective liquid nozzle 6.

While the first and second embodiments of the present invention have thus been described, the present invention is not limited to these embodiments. Various modifications may be made within the scope of the present invention defined by the appended claims.

In the first embodiment described above, the controller 7 horizontally moves the liquid droplet nozzle 5 along the path X1, while the rotation speed of the substrate W rotated by the spin chuck 2 and the spouting speed of the protective liquid spouted from the protective liquid nozzle 6 are kept constant in the second covering step. However, the controller 7 may change the rotation speed of the substrate W and/or the spouting speed of the protective liquid, while horizontally moving the liquid droplet nozzle 5 along the path X1 in the second covering step. More specifically, the controller 7 may increase the spouting speed of the protective liquid as the target position P1 approaches the center of the upper surface of the substrate W, while keeping the rotation speed of the substrate W constant in the second covering step. Further, the controller 7 may increase the rotation speed of the substrate W as the target position P1 approaches the center of the upper surface of the substrate W, while keeping the spouting speed of the protective liquid constant in the second covering step.

As described above, the protective liquid supplied to the substrate W is accelerated by the rotation of the substrate W. The circumferential speed of the substrate W decreases in a direction toward the center (rotation center C1) of the upper surface of the substrate W. If the rotation speed of the substrate W and the spouting speed of the protective liquid are constant, the flow speed of the protective liquid at a given position on the substrate W is reduced as a distance between the given position and the rotation center C1 decreases. Where the distance between the rotation center C1 and the target position P1 is shorter, the flow-in speed of the protective liquid flowing into the spouting directions T1 is correspondingly reduced. Therefore, the controller 7 may change the substrate rotation speed and/or the protective liquid spouting speed according to the distance between the rotation center C1 and the target position P1 to stabilize the flow speed of the protective liquid. In this case, the protective liquid flows into the spouting regions T1 at the constant speed and, even if the distance between the rotation center C1 and the target position P1 is shorter, the protective liquid film can be reliably formed as covering the spouting regions T1. This substantially prevents the upper surface center portion of the substrate W from being specifically damaged (suffering from specific damages).

In the first embodiment described above, the spouts 32 are aligned in the plural lines L. That is, the spouts 32 are linearly arranged in the plural lines L in the lower surface 5a of the liquid droplet nozzle 5. However, the arrangement of the spouts 32 is not limited to the linear arrangement. For example, the spouts 32 may be arranged in a spout arrangement region provided in the lower surface 5a of the liquid droplet nozzle 5. In this case, the shape of the spout arrangement region may be rectangular or round. The spouts 32 may be arranged in evenly-spaced relation or in unevenly-spaced relation within the spout arrangement region.

In the first embodiment described above, the treatment liquid droplets are caused to impinge on the entire upper surface of the substrate W by moving the liquid droplet nozzle 5 while rotating the substrate W. That is, both of the substrate W and the liquid droplet nozzle 5 are moved. However, either of the substrate W and the liquid droplet nozzle 5 may be moved to cause the treatment liquid droplets to impinge on the entire upper surface of the substrate W. More specifically, the liquid droplet nozzle 5 may be moved with the substrate W kept stationary so that the spouting regions T1 pass across the entire upper surface of the substrate W. Further, the substrate W may be moved with the liquid droplet nozzle 5 kept stationary so that the spouting regions T1 pass across the entire upper surface of the substrate W.

In the first embodiment described above, the single protective nozzle 6 is provided for the single liquid droplet nozzle 5. However, a plurality of protective liquid nozzles 6 may be provided for the single liquid droplet nozzle 5. For example, two protective liquid nozzles 6 may be respectively located upstream and downstream of the liquid droplet nozzle 5 with respect to the rotation direction Dr of the substrate W. In this case, the two protective liquid nozzles 6 are preferably located symmetrically with respect to the liquid droplet nozzle 5.

Where the protective liquid nozzles 6 are located upstream and downstream of the liquid droplet nozzle 5, one of the protective liquid nozzles 6 spouts the protective liquid toward a target position located upstream of the spouting regions T1 with respect to the rotation direction Dr of the substrate W, and the other protective liquid nozzle 6 spouts the protective liquid toward a target position located downstream of the spouting regions T1 with respect to the rotation direction Dr of the substrate W. Even if the controller 7 moves the liquid droplet nozzle 5 along the path X1 between peripheral edge positions as seen in plan (full-scanning operation), either one of the target positions can be constantly located upstream of the spouting regions T1. This makes it possible to reliably supply the protective liquid to the spouting regions T1 wherever the spouting regions T1 are located on the substrate W.

In the first embodiment described above, the path X1 is curved. Alternatively, the path X1 may be linear. That is, the path X1 may be a straight line extending parallel to the upper surface of the substrate W and extending through the center C1 of the upper surface of the substrate W as seen perpendicularly to the upper surface of the substrate W.

In the first and second embodiments described above, the substrate treatment apparatuses 1, 201 are adapted to treat the round substrate such as a semiconductor wafer, but may be adapted to treat a polygonal substrate such as a glass substrate for a liquid crystal display device.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2011-070495 filed in the Japan Patent Office on Mar. 28, 2011 and Japanese Patent Application No. 2012-027423 filed in the Japanese Patent Office on Feb. 10, 2012, the disclosure of which are incorporated herein by reference in its entirety.

What is claimed is:

1. A substrate treatment method, comprising
a substrate holding step of horizontally holding a substrate;
a substrate rotating step of rotating the substrate about a vertical rotational axis extending through a center portion of an upper surface of the substrate;
a treatment liquid droplet supplying step of spraying droplets of a treatment liquid from a liquid droplet nozzle to a spouting region on the upper surface of the substrate while the liquid droplet nozzle being moved such that the spouting region moves between the center portion and a peripheral edge portion on the upper surface of the substrate, the spouting region having a rectangular shape extending in a longitudinal direction;
a protective liquid nozzle moving step of moving a protective liquid nozzle while maintaining a positional relationship between the liquid droplet nozzle and the protective liquid nozzle such that the protective liquid nozzle is arranged at an upstream side of the liquid droplet nozzle with respect to a substrate rotation direction and that an angle formed between a spouting direction of the protective liquid nozzle and the longitudinal direction of the spouting region is ranging from 25 degrees to 35 degrees in plan view; and
a protective liquid supplying step of spouting a protective liquid from the protective liquid nozzle onto the upper surface of the substrate during the nozzle moving step, thereby producing a flow of the protective liquid on the upper surface of the substrate toward the spouting region along the upper surface of the substrate such that the droplets of the treatment liquid impinge on the spouting region so as to cover the spouting region with a liquid film of the protective liquid film.

2. The substrate treatment method according to claim 1, wherein the nozzle moving step maintains a distance between the protective liquid nozzle and the liquid droplet nozzle to be 15-40 mm.

3. The substrate treatment method according to claim 1, wherein the angle formed between the spouting direction of the protective liquid nozzle and the longitudinal direction of the spouting region is 30 degrees in plan view.

4. The substrate treatment method according to claim 1, wherein the protective liquid is spouted so that the protective liquid triangularly spreads on the upper surface of the substrate.

5. The substrate treatment method according to claim 1, wherein the protective liquid is spouted from the protective liquid nozzle at an angle of 10 to 40 degrees with respect to the upper surface of the substrate.

6. The substrate treatment method according to claim 1, wherein the protective liquid is spouted so that a path along which the protective liquid flows across the spouting region on the upper surface of the substrate is shorter than a length of the spouting region as measured in the longitudinal direction.

7. The substrate treatment method according to claim 1, further comprising a flow speed controlling step of controlling a flow speed of the protective liquid flowing on the substrate so that the protective liquid spouted from the protective liquid nozzle flows into the spouting region at a constant flow speed wherever the spouting region is located on the upper surface of the substrate.

8. The substrate treatment method according to claim 1,
wherein the liquid droplet nozzle has a surface opposed to the spouting region and having a spout from which the droplets of the treatment liquid are spouted,
wherein the protective liquid spouted from the protective liquid nozzle spreads on the upper surface of the substrate to flow into a space defined between the opposed surface and the upper surface of the substrate.

9. The substrate treatment method according to claim 1, wherein the protective liquid is spouted from the protective liquid nozzle at a spouting speed of not less than 1.6 m/s.

* * * * *